United States Patent
Sashida

(10) Patent No.: US 7,285,460 B2
(45) Date of Patent: Oct. 23, 2007

(54) SEMICONDUCTOR DEVICE AND METHOD OF MANUFACTURING THE SAME

(75) Inventor: Naoya Sashida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 125 days.

(21) Appl. No.: 11/214,895

(22) Filed: Aug. 31, 2005

(65) Prior Publication Data

US 2006/0001026 A1 Jan. 5, 2006

Related U.S. Application Data

(62) Division of application No. 10/650,070, filed on Aug. 28, 2003, now Pat. No. 6,953,950.

(30) Foreign Application Priority Data

Aug. 30, 2002 (JP) .............................. 2002-255036

(51) Int. Cl.
*H01L 21/8242* (2006.01)
*H01L 21/8234* (2006.01)
(52) U.S. Cl. ...................... 438/239; 438/238; 438/901; 257/E21.364
(58) Field of Classification Search ................ 438/239, 438/238, 901; 257/E21.364
See application file for complete search history.

(56) References Cited

U.S. PATENT DOCUMENTS 5,475,248 A * 12/1995 Takenaka ................. 257/295

6,368,909 B2 4/2002 Koo
6,570,203 B2 5/2003 Hikosaka et al.
2002/0047111 A1 4/2002 Judai

FOREIGN PATENT DOCUMENTS

| EP | 0 704 887 A2 | 3/1996 |
|---|---|---|
| EP | 1061573 A2 | 12/2000 |
| JP | 06-104345 | 4/1994 |
| JP | 8-158036 | 6/1996 |
| JP | 11-330390 | 11/1999 |
| JP | 2001-36025 | 2/2001 |
| JP | 2001-60669 | 3/2001 |
| JP | 2002-942021 | 3/2002 |

OTHER PUBLICATIONS

Office Action dated Feb. 21, 2006, issued in corresponding Japanese application No. 2002-255036.

* cited by examiner

*Primary Examiner*—Long K. Tran
(74) *Attorney, Agent, or Firm*—Westerman, Hattori, Daniels & Adrian, LLP.

(57) ABSTRACT

There is provided a semiconductor device which comprises a first interlayer insulating film (first insulating film) formed over a silicon (semiconductor) substrate, a capacitor formed on the first interlayer insulating film and having a lower electrode, a dielectric film, and an upper electrode, a fourth interlayer insulating film (second insulating film) formed over the capacitor and the first interlayer insulating film, and a metal pattern formed on the fourth interlayer insulating film over the capacitor and its periphery to have a stress in an opposite direction to the fourth interlayer insulating film. As a result, characteristics of the capacitor covered with the interlayer insulating film can be improved.

11 Claims, 32 Drawing Sheets

Sample Structure ; TiN(100nm)/Al-Cu(500nm)/SiO2(100nm)/Si

SEMICONDUCTOR DEVICE AND METHOD OF MANUFACTURING THE SAME

This application is a divisional of application Ser. No. 10/650,070, filed Aug. 28, 2003. Now U.S. Pat. No. 6,953,950

CROSS-REFERENCE TO RELATED APPLICATIONS

This application is based upon and claims priority of Japanese Patent Application No. 2002-255036, filed on Aug. 30, 2002, the contents being incorporated herein by reference.

BACKGROUND OF THE INVENTION

1. Field of the Invention

The present invention relates to a semiconductor device and a method of manufacturing the same and, more particularly, to a semiconductor device having a capacitor and a method of manufacturing the same.

2. Description of the Related Art

As the nonvolatile memory that can stores the information after the power supply is turned OFF, the flash memory and the ferroelectric memory (FeRAM) are known.

The flash memory has the floating gate buried in the gate insulating film of the insulated gate field effect transistor (IGFET), and stores the information by accumulating the charge, as the stored information, in the floating gate. In order to write and erase the information, tunnel current must be supplied to the gate insulating film, which requires a relatively high voltage.

The FeRAM has the ferroelectric capacitor that stores the information by utilizing the hysteresis characteristic of the ferroelectric substance. The ferroelectric film formed between the upper electrode and the lower electrode in the ferroelectric capacitor causes the polarization in response to the value of the voltage applied between the upper and lower electrodes, thereby leaving the spontaneous polarization after the applied voltage is removed. When the polarity of the applied voltage is reversed, the polarity of the spontaneous polarization is also reversed. The information can be read by detecting the polarity and the magnitude of this spontaneous polarization.

The FeRAM has an advantage in that it operates with lower voltage and higher writing speed at lower power consumption than the flash memory.

As set forth in Patent Application Publication (KOKAI) 2001-60669, for example, the memory cell of the FeRAM has the MOS transistor formed on the silicon substrate, the first interlayer insulating film formed on the silicon substrate and the MOS transistor, the ferroelectric capacitor formed on the first interlayer insulating film, the second interlayer insulating film formed on the ferroelectric capacitor and the first interlayer insulating film, the conductive plug buried in the hole that is formed in the first and second interlayer insulating films and connected to the MOS transistor, the first wiring pattern for connecting the conductive plug and the upper electrode of the ferroelectric capacitor, the third interlayer insulating film formed on the first wiring pattern and the second interlayer insulating film, and the second wiring pattern formed on the third interlayer insulating film.

The interlayer insulating film for covering the ferroelectric capacitor has a strong compressive stress, which generates a force in the direction that the insulating film itself expands. As a result, a shrinkage force is applied to the ferroelectric capacitor every time when the interlayer insulating films are formed on the ferroelectric capacitor to overlap with each other, which causes the degradation of the characteristics of the ferroelectric capacitor.

Also, when the first wiring pattern is formed of aluminum, the residual polarization characteristic of the ferroelectric capacitor degrades due to a tensile force of the first wiring pattern. In contrast, in Patent Application Publication (KOKAI) 2001-36025, it is set forth that the aluminum film is heated at the temperature exceeding a Curie point of the ferroelectric film of the ferroelectric capacitor for the purpose of relaxing the tensile force and, after that, the wiring pattern is formed by patterning the aluminum film.

However, since there exists the interlayer insulating film in the gaps between the first wiring pattern, there remains problem that the compressive stress of the interlayer insulating film degrades the ferroelectric capacitor, irrespective of the stress of the first wring pattern.

In contrast, in Patent Application Publication (KOKAI) Hei 11-330390, it is set forth that the interlayer insulating film is formed to have the tensile stress to the ferroelectric capacitor. However, the interlayer insulating film having the tensile stress contains a large amount of moisture, which poses another problem that moisture degrades the capacitor.

SUMMARY OF THE INVENTION

It is an object of the present invention to provide a semiconductor device capable of improving characteristics of a capacitor that is covered with an interlayer insulating film, and a method of manufacturing the same.

According to an aspect of the present invention, there is provided a semiconductor device which comprises a first insulating film formed over a semiconductor substrate; a capacitor formed on the first insulating film and having a lower electrode, a dielectric film, and an upper electrode; a second insulating film formed over the capacitor and the first insulating film; and a metal pattern formed on the second insulating film over the capacitor and a periphery thereof and having a stress in an opposite direction to a stress of the second insulating film.

Next, an advantage of the present invention will be explained hereunder.

According to the semiconductor device of the present invention, the metal pattern having the stress in the opposite direction to the stress of the second insulating film is provided. Therefore, the stress applied from the second insulating film to the capacitor can be relaxed by the stress of the metal pattern and thus the ferroelectric characteristic of the capacitor can be improved. In addition, since the metal pattern does not discharge the moisture unlike the insulating film, the capacitor is not deteriorated by the moisture.

Such metal pattern may be formed on the second insulating film or may be formed in the recess that is formed in the second insulating film.

According to another aspect of the present invention, there is provided a manufacturing method of semiconductor device which comprises the steps of forming a first insulating film over a semiconductor substrate; forming capacitors, each having a lower electrode, a dielectric film, and an upper electrode, on the first insulating film in a cell region; forming a second insulating film over the capacitor and the first insulating film; forming a metal film on the second insulating film; forming a metal pattern, which covers the cell region, by patterning the metal film; and heating the metal film at a melting point or less of the metal film before or after the formation of the metal pattern, to change a stress of the metal film.

Next, another advantage of the present invention will be explained hereunder.

According to the manufacturing method of semiconductor device of the present invention, the stress of the metal film is changed by heating the metal film at the temperature of the melting point or less before or after the formation of the metal pattern. Therefore, for example, if the stress of the metal film is changed into the opposite stress to the stress of the second insulating film, the stress of the second insulating film can be relaxed by the metal film and thus the ferroelectric characteristic of the capacitor can be improved.

DETAILED DESCRIPTION OF THE PREFERRED EMBODIMENTS

Embodiments of the present invention will be explained with reference to the drawings hereinafter.

First Embodiment

FIGS. 1 to 13 are sectional views showing a method of manufacturing semiconductor device according to a first embodiment of the present invention in order of step. FIG. 14 is a plan view showing the semiconductor device in FIG. 13.

First, steps for forming the structure shown in FIG. 1 will be explained.

Figure 1:
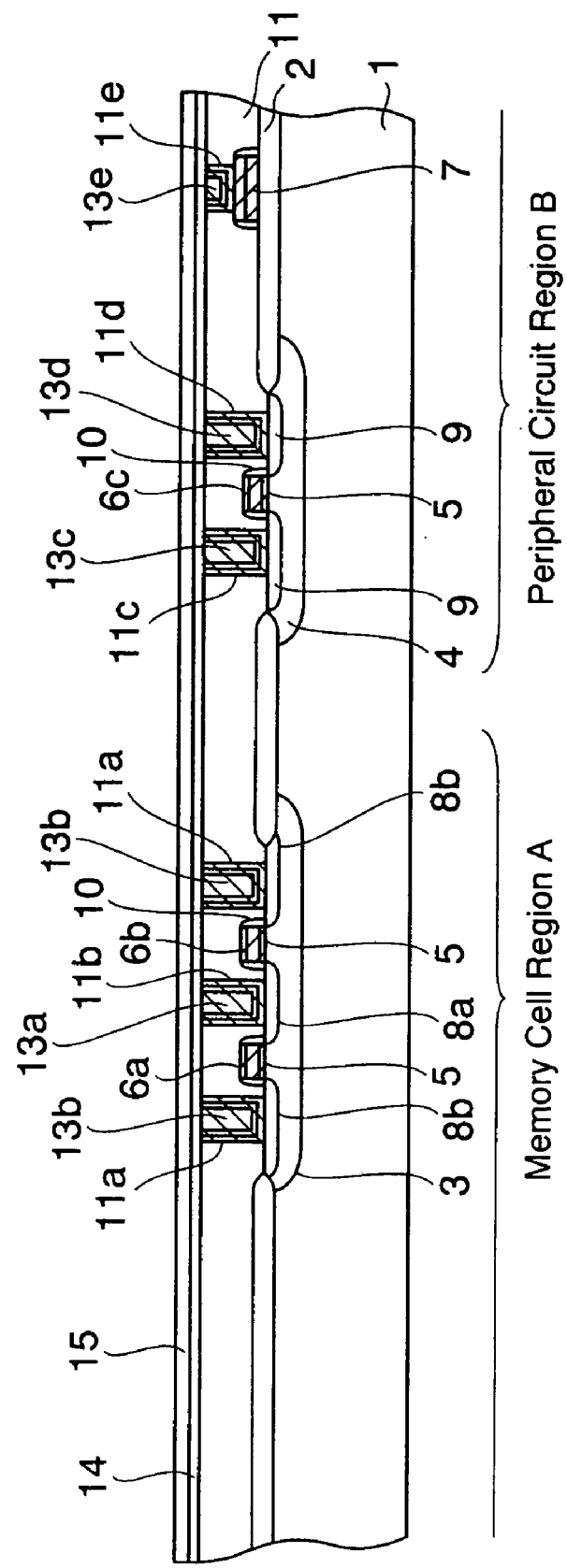
FIG. 1, FIG. 2, FIG. 3, FIG. 4, FIG. 5, FIG. 6, FIG. 7, FIG. 8, FIG. 9, FIG. 10, FIG. 11, FIG. 12, and FIG. 13 are sectional views showing steps of forming a semiconductor device according to a first embodiment of the present invention.

As shown in FIG. 1, LOCOS (Local Oxidation of Silicon) is formed as an element isolation insulating film 2 on a part of a surface of a p-type silicon (semiconductor) substrate 1. Another element isolation structure may be employed in place of the insulating film 2, such as STI (Shallow Trench Isolation).

After the element isolation insulating film 2 is formed, a p-well 3 and an n-well 4 are formed by selectively introducing the p-type impurity and the n-type impurity into the predetermined active regions in a memory cell region A and a peripheral circuit region B of the silicon substrate 1. It should be noted that p-well is also formed in the peripheral circuit regions for forming CMOS, although not shown FIG. 1.

Then, silicon oxide films are formed as a gate insulating film 5 by thermally oxidizing the surfaces of the active regions of the silicon substrate 1.

Then, an amorphous silicon film and a tungsten silicide film are formed on the overall upper surface of the silicon substrate 1. Then, gate electrodes 6a, 6b, 6c and a wiring 7 are formed by patterning the amorphous silicon film and the tungsten silicide film into predetermined shapes by virtue of the photolithography method. In this case, a polysilicon film may be formed in place of the amorphous silicon film.

In the memory cell region A, two gate electrodes 6a, 6b are arranged in almost parallel on one p-well 3, and these gate electrodes 6a, 6b constitute a part of the word line WL.

Then, the n-type impurity is ion-implanted into the p-well 3 in the memory cell region A on both sides of the gate electrodes 6a, 6b. Thus, n-type impurity diffusion regions 8a, 8b serving as the source/drain of the n-channel MOS transistor are formed. At the same time, an n-type impurity diffusion region may be formed in the p-well (not shown) in the peripheral circuit region B. Then, the p-type impurity is ion-implanted into the n-well 4 in the peripheral circuit region B on both sides of the gate electrode 6c. Thus, p-type impurity diffusion regions 9 serving as the source/drain of the p-channel MOS transistor are formed. The individual implantation of the n-type impurity and the p-type impurity is carried out by using a resist pattern respectively.

Then, an insulating film is formed on an overall surface of the silicon substrate 1. Then, sidewalls 10 are left only on both side portions of the gate electrodes 6a, 6b, 6c and the wiring 7 by etching back the insulating film. As the insulating film, a silicon oxide (SiO$_2$) film is formed by the CVD method, for example.

Then, a silicon oxide nitride (SiON) film of about 200 nm thickness is formed as a cover film on the overall surface of the silicon substrate 1 by the plasma CVD method. Then, a silicon oxide (SiO$_2$) film of about 1.0 μm thickness is grown on the cover film by the plasma CVD method using a TEOS gas. A first interlayer insulating film (first insulating film) 11 is constructed by the SiON film and the SiO$_2$ film. It should be understood that the SiO$_2$ film formed by the plasma CVD method using the TEOS gas is also referred to as TEOS film hereinafter.

Then, as the densifying process of the first interlayer insulating film 11, the first interlayer insulating film 11 is annealed at the temperature of 700° C. for 30 minutes in the atmospheric-pressure nitrogen atmosphere. Thereafter, the upper surface of the first interlayer insulating film 11 is planarized by polishing the first interlayer insulating film 11 by virtue of the chemical mechanical polishing (abbreviated as "CMP" hereinafter) method.

Then, contact holes 11a to 11d having depths, which reach the n-type impurity diffusion regions 8a, 8b on both sides of the gate electrodes 6a, 6b in the memory cell region A and the p-type impurity diffusion regions 9 in the peripheral circuit region B respectively, and a via hole 11e having a depth, which reaches the wiring 7 in the peripheral circuit region B, are formed in the first interlayer insulating film 11 by the photolithography method respectively. Then, a Ti (titanium) thin film of 20 nm thickness and a TiN (titanium nitride) thin film of 50 nm thickness are formed sequentially on an upper surface of the first interlayer insulating film 11 and the inner surfaces of the holes 11a to 11f by the sputter method. Then, a W (tungsten) film is grown on the TiN thin film by the CVD method. As a result, the tungsten film is buried in the contact holes 11a to 11d and the via hole 11e.

Then, the W film, the TiN thin film, and the Ti thin film are polished by the CMP method until an upper surface of the first interlayer insulating film 11 is exposed. The tungsten film, etc., which are left in the holes 11a to 11e after the polishing, are used as conductive plugs 13a to 13e that electrically connect wirings described later and the impurity diffusion regions 8a, 8b, 9 and the wiring 7.

In one p-well 3 in the memory cell region A, the first conductive plug 13a that is formed on the n-type impurity diffusion region 8a being put between two gate electrodes 6a, 6b is connected to the bit line described later. Also, the second conductive plugs 13b that are formed on both sides of the first conductive plug 13a are connected to the capacitors described later.

Then, in order to prevent the oxidation of the conductive plugs 13a to 13e, an SiON film 14 of 100 nm thickness is formed on the first interlayer insulating film 11 and the conductive plugs 13a to 13e by the plasma CVD method. Then, an $SiO_2$ film 15 of 150 nm thickness is formed by using TEOS as the film forming gas. Then, the SiON film 14 and the $SiO_2$ film 15 are annealed at the temperature of 650 to 700° C. to degas the gas from these films.

Figure 2:
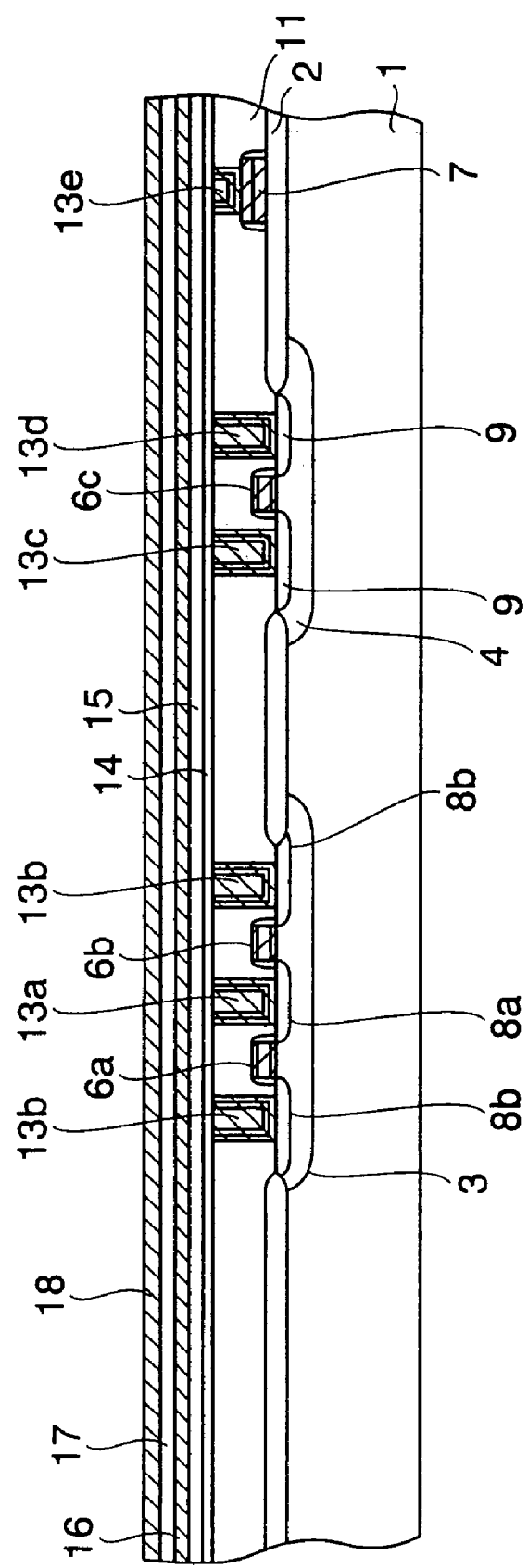

Next, steps for forming the structure shown in FIG. 2 will be explained hereunder.

First, a first conductive film 16 having a double-layered structure is formed by depositing a Ti layer and a Pt layer on the $SiO_2$ film 15 sequentially by the DC sputter method to have a thickness of 20 nm and a thickness of 175 nm respectively.

Then, a lead zirconate titanate ($Pb(Zr_{1-x}Ti_x)O_3$; PZT) film as the ferroelectric material is formed on the first conductive film 16 by the RF sputter method to have a thickness of 100 to 300 nm, e.g., 200 nm. Thus, a PZT film 17 is formed.

As the method of forming the ferroelectric material film, there are the spin-on method, the sol-gel method, the MOD (Metal Organic Deposition) method, the MOCVD method, etc. in addition to the above sputter method. Also, as the ferroelectric material, there are lead lanthanum zirconate titanate (PLZT), $SrBi_2(Ta_xNb_{1-x})_2O_9$ (where 0<x<1), $Bi_4Ti_3O_{12}$, etc. in addition to PZT. Furthermore, if DRAM is to be formed, the high-dielectric material such as (BaSr)$TiO_3$ (BST), strontium titanate (STO), etc. may be employed in place of the above ferroelectric material.

Then, as the crystallizing process of the PZT film 17, RTA (Rapid Thermal Annealing) is executed at the temperature of 750° C. for 60 second in the oxygen atmosphere.

Then, an $IrO_x$ film of about 200 nm thickness is formed as a second conductive film 18 on the PZT film 17 by the DC sputter method.

Figure 3:
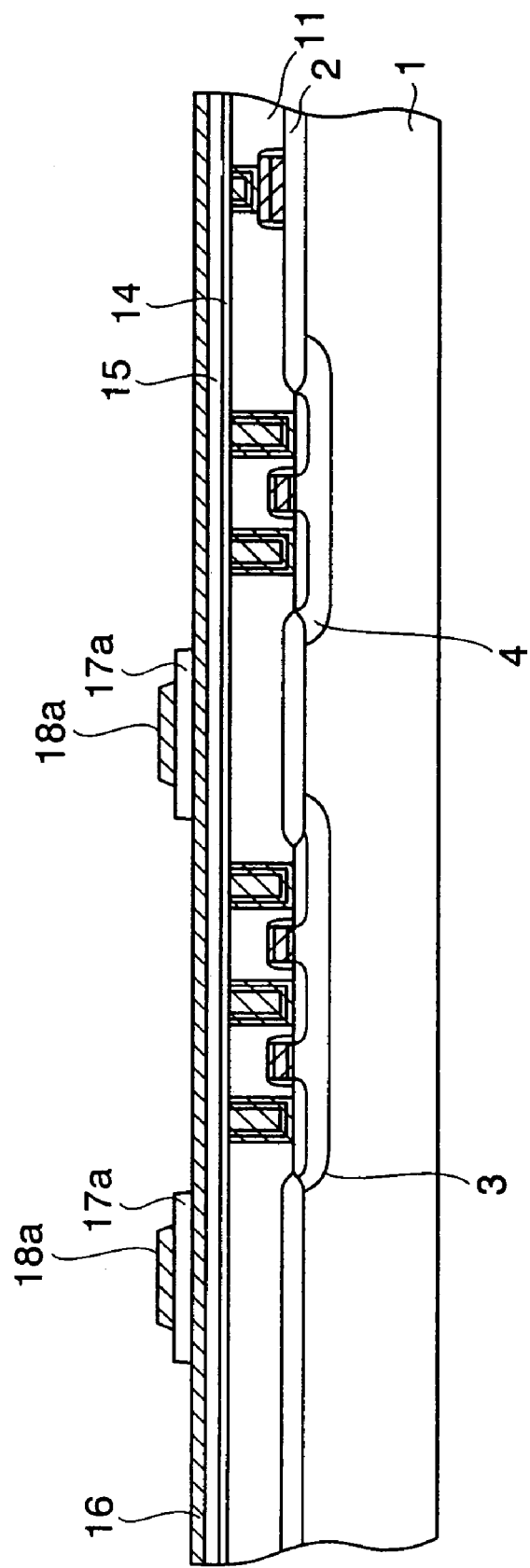

Next, steps for forming the structure shown in FIG. 3 will be explained hereunder.

First, upper electrodes 18a are formed by patterning the second conductive film 18. Then, in order to remove the damage of the PZT film 17 which is the ferroelectric substance, the recovery annealing of the PZT film 17 is executed at 650° C. for 60 minute in the oxygen atmosphere, for example.

Then, capacitor dielectric films 17a are left at least under the upper electrodes 18a by patterning the PZT film 17. Then, the dielectric films 17a are annealed at 650° C. for 60 minute in the oxygen atmosphere, for example.

Figure 4:
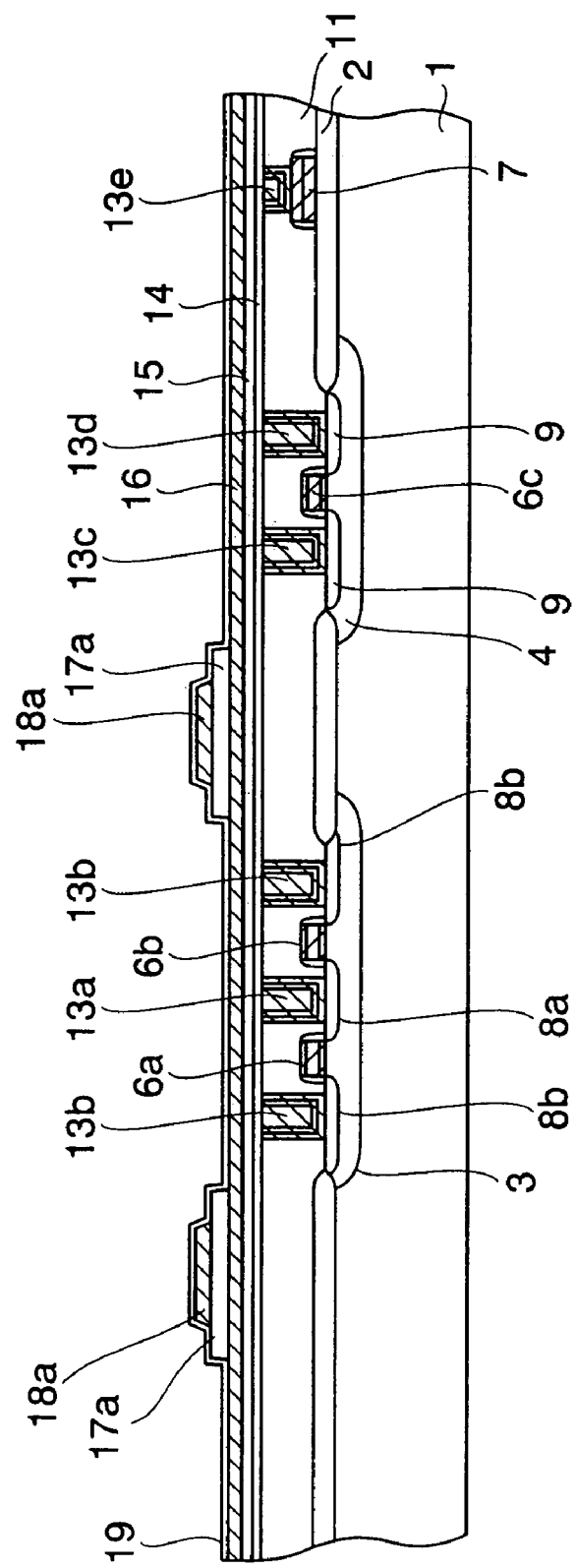

Then, as shown in FIG. 4, first capacitor protection insulating films 19 made of aluminum oxide ($Al_2O_3$) are formed on the upper electrodes 18a, the dielectric films 17a, and the first conductive film 16 by the sputter to have a thickness of 50 nm. Then, in order to relax the damage of the dielectric films 17a caused by the sputter, the dielectric films 17a are annealed at 550° C. for 60 minute in the oxygen atmosphere, for example.

Figure 5:
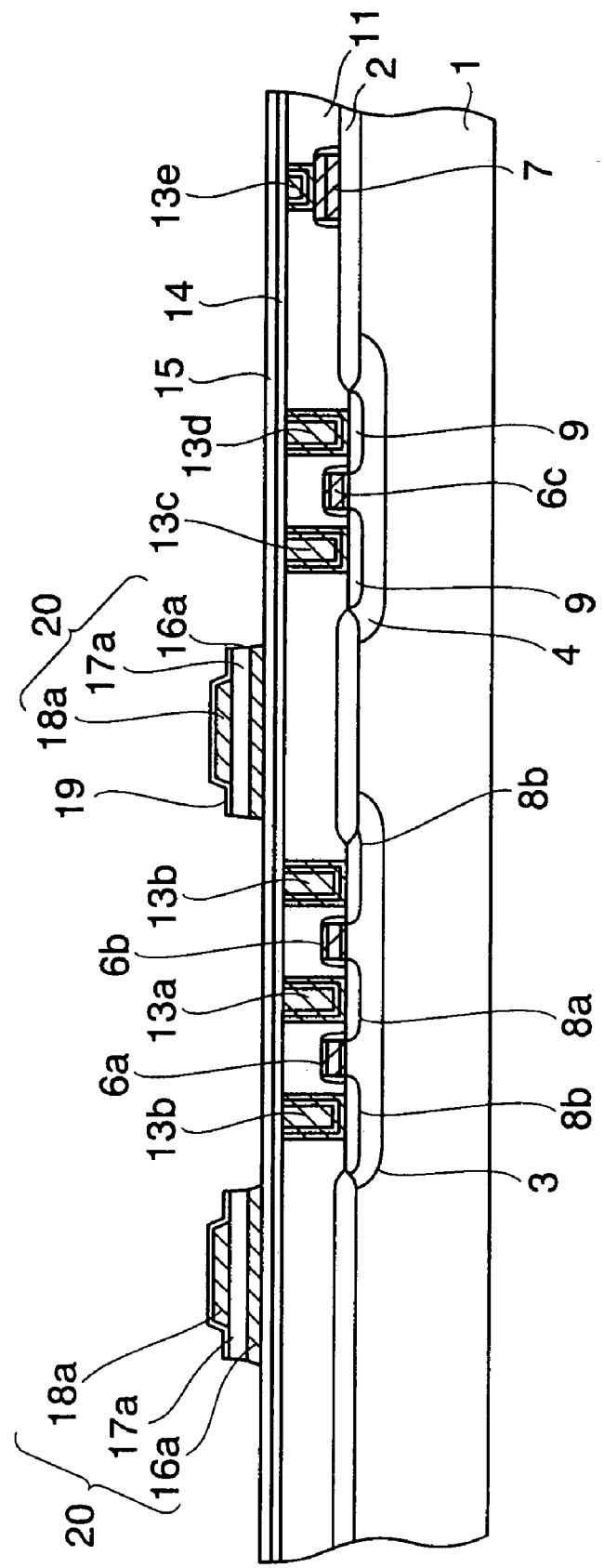

Then, as shown in FIG. 5, lower electrodes 16a are formed by patterning the first conductive film 16. The first capacitor protection insulating films 19 is patterned, along with the first conductive film 16.

Thus, ferroelectric capacitors 20 each consisting of the upper electrode 18a, the dielectric film 17a, and the lower electrode 16a are formed. Then, the ferroelectric capacitors 20 are annealed at 650° C. for 30 minute in the oxygen atmosphere, for example.

Figure 6:
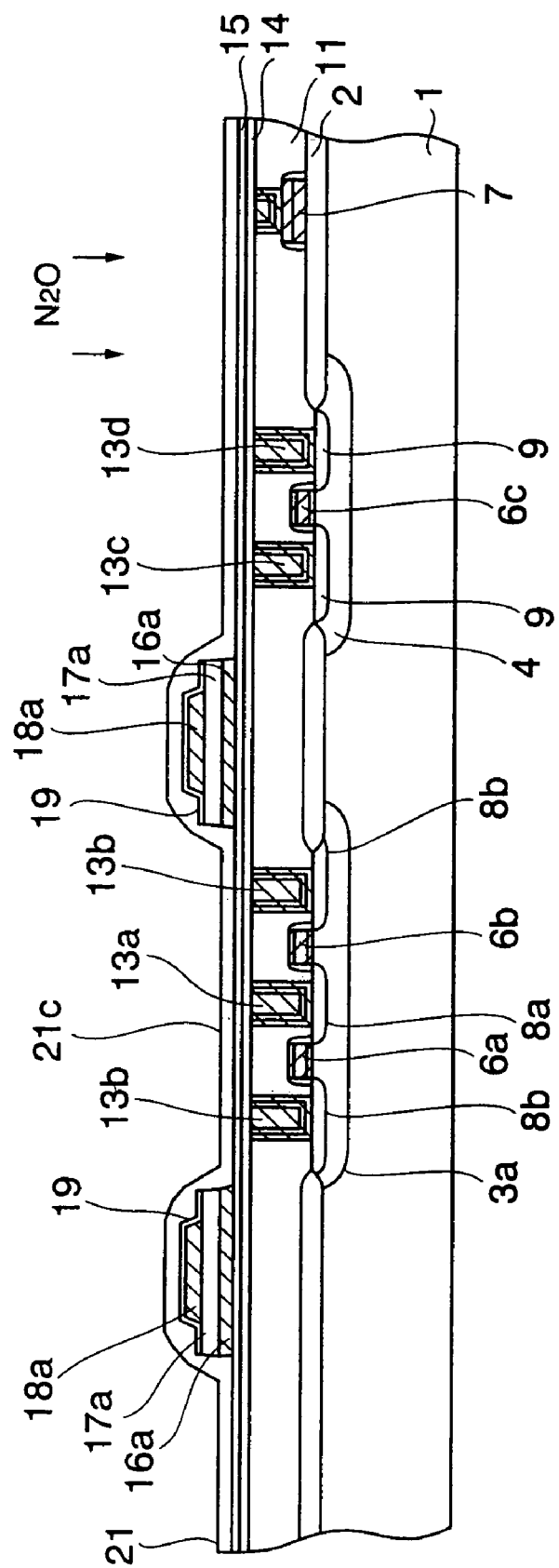

Next, steps for forming the structure shown in FIG. 6 will be explained hereunder.

First, a second interlayer insulating film 21 is formed on the ferroelectric capacitors 20 and the overall surface of the $SiO_2$ film 15. The second interlayer insulating film 21 is formed as a double-layered structure that consists of an insulating film, which is formed first by using TEOS to have a thickness of about 480 nm, and an SOG film, which is formed on the insulating film to have a thickness of about 90 nm. Then, a thickness of the second interlayer insulating film 21 is reduced to about 270 nm by etching back these films by a thickness of about 300 nm.

Then, the plasma annealing is applied to the second interlayer insulating film 21 and various films thereunder at the temperature of 350° C. by using the $N_2O$ gas. In this plasma annealing, the silicon substrate 1 is loaded into the chamber of the plasma generating equipment, then an $N_2O$ gas and an $N_2$ gas are introduced into the chamber at flow rates of 700 sccm and 200 sccm respectively, and then the second interlayer insulating film 21 and various underlying films are exposed to the plasma at the substrate temperature of less than 450° C. for the time of more than 1 minute. As a result, the nitrogen is caused to come deeply into the inside from a surface of the second interlayer insulating film 21 to prevent the penetration of the moisture. In the following, this process is called the $N_2O$ plasma process. In this embodiment, 350° C. and 2 minutes, for example, are selected as the annealing temperature and the annealing time respectively.

Figure 7:
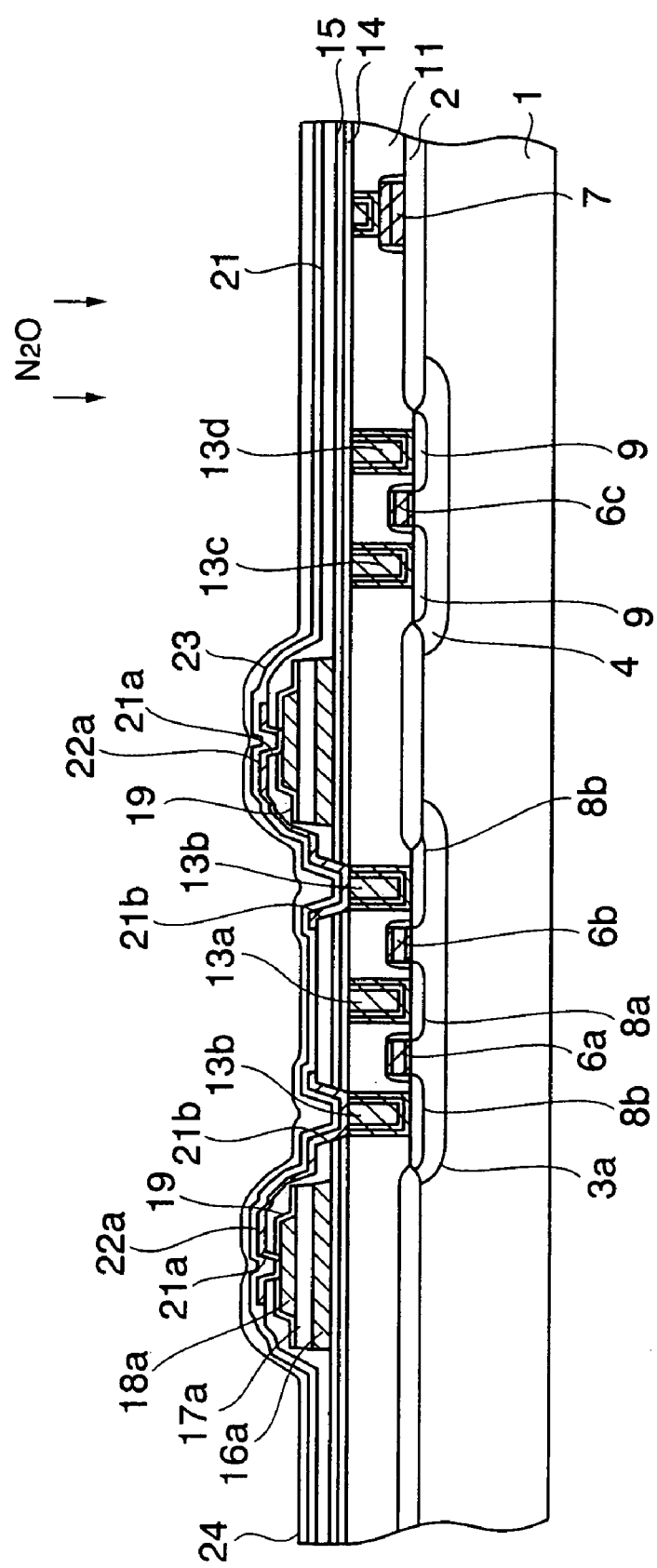

Next, steps for forming the structure shown in FIG. 7 will be explained hereunder.

First, first contact holes 21a are formed in the second interlayer insulating film 21 on the upper electrodes 16a of the ferroelectric capacitors 20 by the photolithography method. At the same time, contact holes (not shown) are formed on the contact areas of the lower electrodes, which are arranged in the direction perpendicular to this sheet of FIG. 7. Then, the recovery annealing is applied to the dielectric films 17a. Specifically, the dielectric films 17a are annealed at the temperature of 550° C. for 60 minute in the oxygen atmosphere.

Then, the second interlayer insulating film 21, the $SiO_2$ film 15, and the SiON film 14 are patterned by the photolithography method. Thus, second contact holes 21b are formed on the second conductive plugs 13b, which are located near both ends of the p-well 3 in the memory cell region A, respectively to expose the second conductive plugs 13b. Then, a TiN film of 125 nm thickness is formed on the second interlayer insulating film 21 and in the contact holes 21a, 21b by the sputter method. Then, the TiN film is patterned by the photolithography method. Thus, local wirings 22a each of which electrically connects the second conductive plug 13b and the upper electrode 18a of the ferroelectric capacitor 20 via the contact holes 21a, 21b in the memory cell region A are formed. Then, the annealing is applied to the second interlayer insulating film 21 at 350° C. for 30 minute in the nitrogen ($N_2$) atmosphere.

Then, a second capacitor protection insulating film 23 made of aluminum oxide is formed on the local wirings 22a and the second interlayer insulating film 21 by the sputter method to have a thickness of 20 nm.

Then, a silicon oxide film of about 300 nm thickness is formed as a third interlayer insulating film 24 on the local wirings 22a and the second interlayer insulating film 21 by the plasma CVD method using the TEOS gas. Then, the reforming of the third interlayer insulating film 24 is executed by the $N_2O$ plasma process. The conditions of the $N_2O$ plasma process are set to the same conditions as the $N_2O$ plasma process applied to the second interlayer insulating film 21.

Figure 8:
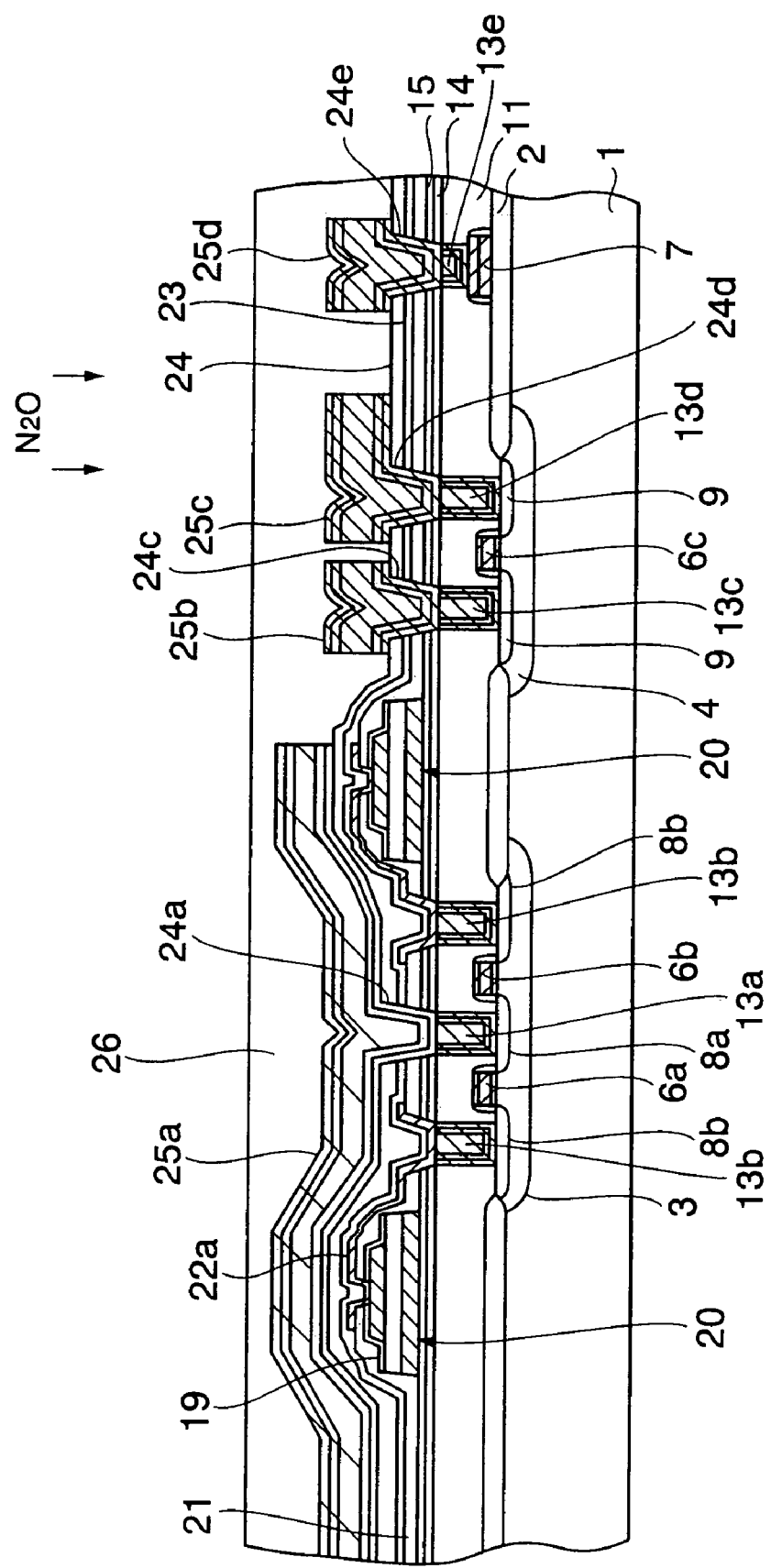

Next, steps for forming the structure shown in FIG. 8 will be explained hereunder.

First, each films ranging from the third interlayer insulating film 24 to the SiON film 14 in the memory cell region A are patterned by the photolithography method. Thus, a contact hole 24a is formed on the first conductive plug 13a positioned in the center of the p-well 3. At the same time, contact holes 24c to 24e are formed on the conductive plugs 13c to 13e in the peripheral circuit region B.

Then, five layers consisting of a Ti film of 20 nm thickness, a TiN film of 50 nm thickness, an Al—Cu film of 600 nm thickness, a Ti film of 5 nm thickness, and a TiN film of 150 nm thickness are laminated sequentially on the third interlayer insulating film 24 and in the contact holes 24c to 24e. Then, these metal films are patterned. Thus, a bit line 25a is formed in the memory cell region A, and wirings 25b, 25c, 25d are formed in the peripheral circuit region B. It should be noted that the Al—Cu film contains Cu by 0.5%, for example. The bit line 25a and the wirings 25b, 25c, 25d are the first-layer aluminum wiring.

Then, a fourth interlayer insulating film (second insulating film) 26 made of $SiO_2$ and having a thickness of about 2.3 μm is formed on the third interlayer insulating film 24, the bit line 25a, and the wirings 25b to 25d by the plasma CVD method using the TEOS gas.

Then, in order to planarize the fourth interlayer insulating film 26, the step of polishing an upper surface of the fourth interlayer insulating film 26 by virtue of the CMP method is employed. A polished depth of the film 26 is set to about 1.2 μm. Then, the reforming of the fourth interlayer insulating film 26 is carried out by the $N_2O$ plasma process. The conditions of this $N_2O$ plasma process are set to the same conditions as the $N_2O$ plasma process applied to the second interlayer insulating film 21.

Figure 9:
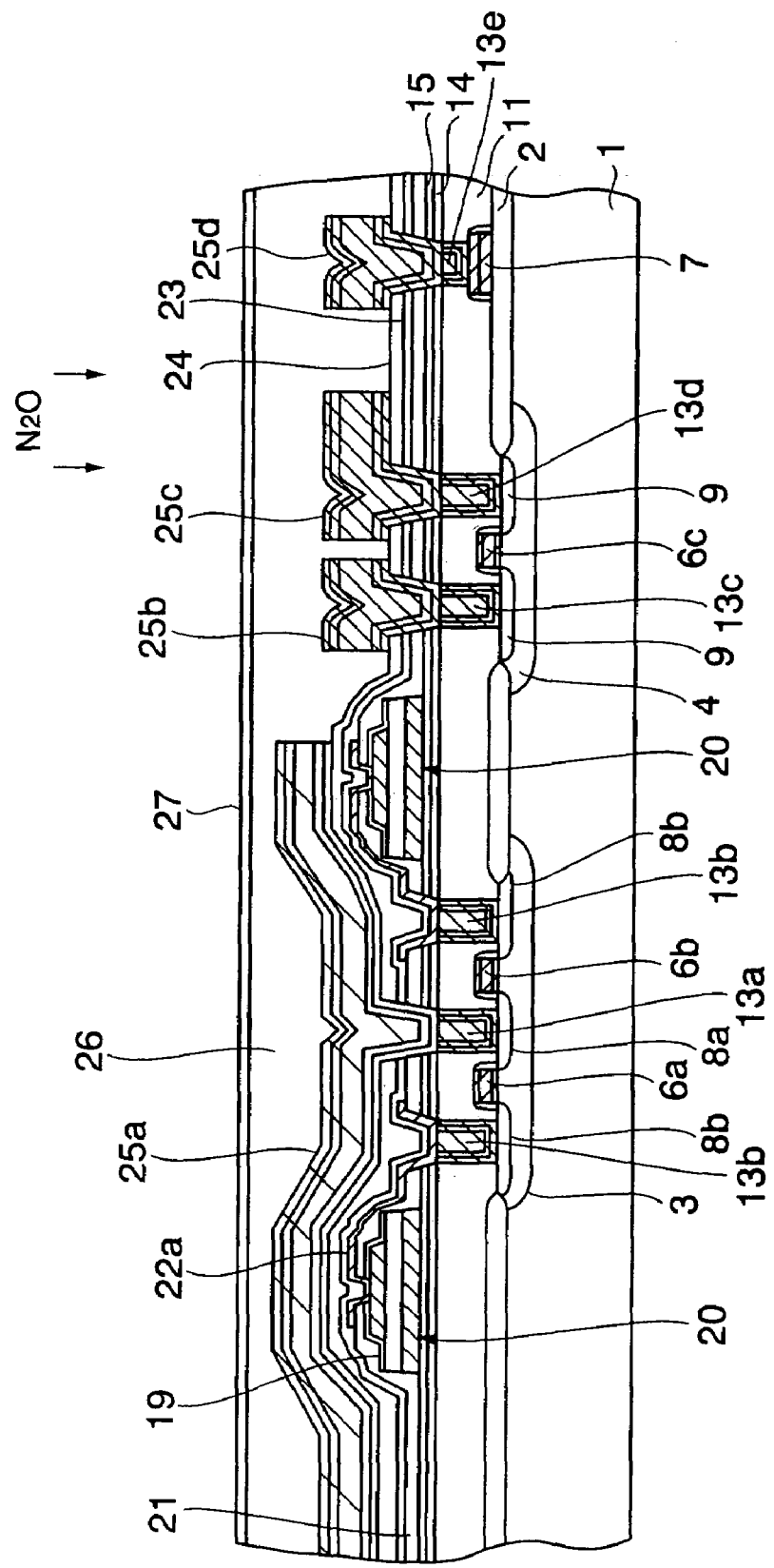

Then, as shown in FIG. 9, a re-deposited interlayer insulating film 27 of about 300 nm thickness is formed on the fourth interlayer insulating film 26 by the plasma CVD method using TEOS. Then, the reforming of the re-deposited interlayer insulating film 27 is carried out by the $N_2O$ plasma process. The conditions of this $N_2O$ plasma process are set to the same conditions as the $N_2O$ plasma process applied to the second interlayer insulating film 21.

Figure 10:
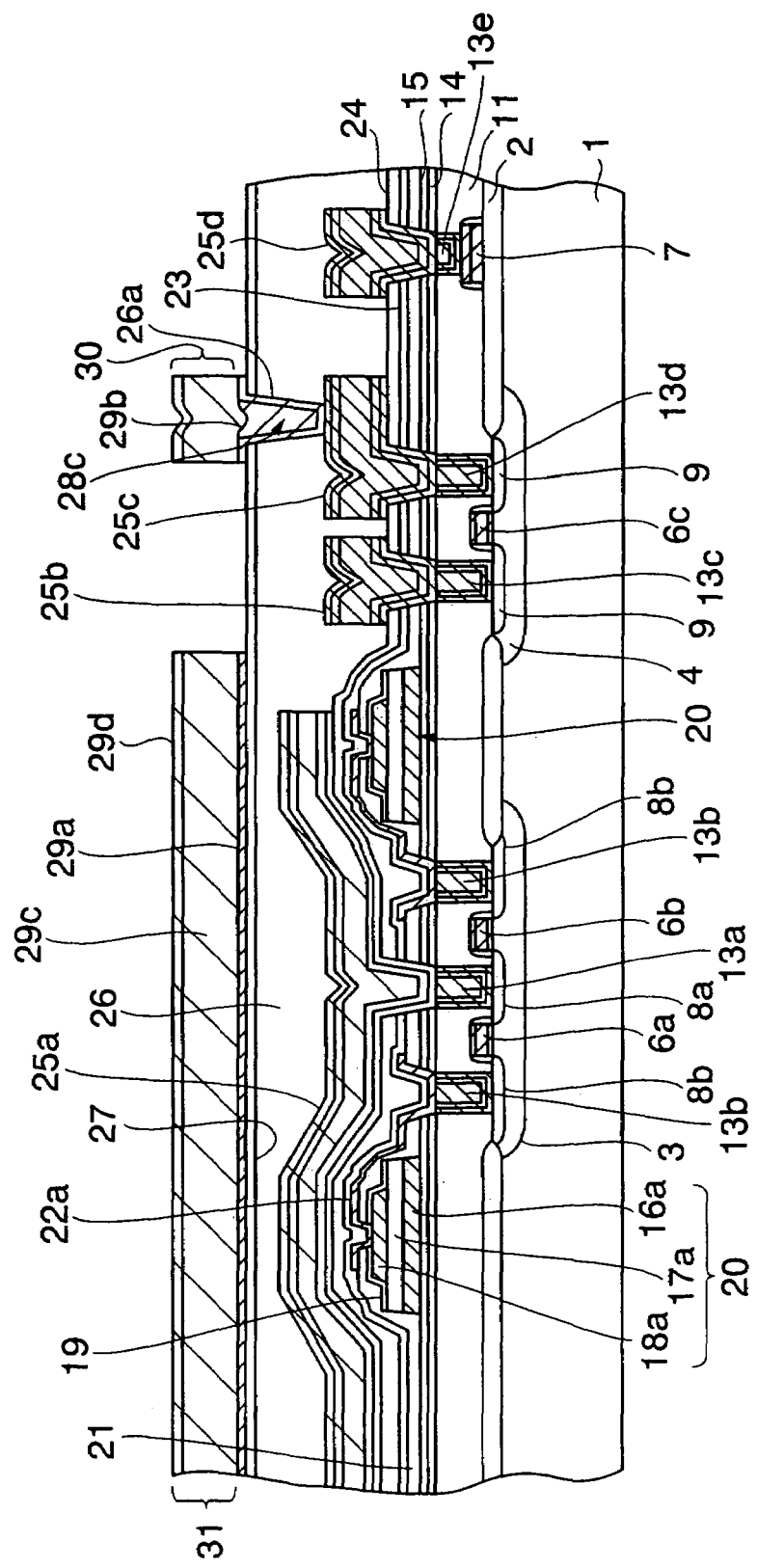

Next, steps for forming the structure shown in FIG. 10 will be explained hereunder.

First, the re-deposited interlayer insulating film 27 and the fourth interlayer insulating film 26 are patterned by the photolithography method. Thus, a via hole 26a that reaches the first-layer aluminum layer, the wiring 25c in the peripheral circuit region B for example, is formed.

Then, a Ti film of 20 nm thickness and a TiN film of 50 nm thickness are formed sequentially on an inner surface of the via hole 26a and an upper surface of the re-deposited interlayer insulating film 27 by the sputtering. These films are used as a glue layer 29a. Then, a tungsten film 29b is formed on the glue layer 29a at the growth temperature of 370° C. by using a $WF_6$ (tungsten hexafluoride) gas, a $SiH_4$ (silane) gas, and $H_2$ (hydrogen).

Then, the tungsten film 29b is removed by the etching-back to leave only in the via hole 26a. At this time, the glue layer 29a is not removed. Here, the tungsten film 29b that is left in the via hole 26a is used as a conductive plug 28c.

Then, an Al—Cu film 29c of 600 nm thickness and a TiN film 29d of 150 nm thickness are formed on the glue layer 29a and the conductive plug 28c. Here, the Al—Cu film 29c contains Cu by 3%.

Then, a multi-layered metal film consisting of the glue layer 29a, the Al—Cu film 29c, and the TiN film 29d is patterned. Thus, a metal pattern 31 for covering an area over a plurality of ferroelectric capacitors 20 is formed in the memory cell region A, and a metal wiring 30 is formed in the peripheral circuit region B. Then, the silicon substrate 1 is fixed onto the susceptor that is maintained at 350° C., then the metal pattern 31 is annealed for 30 minute in the oxygen atmosphere at 2 Torr, and then is annealed at 350° C. for 90 minute in the reduced-pressure atmosphere from which the oxygen is excluded, e.g., the atmosphere of 1 mTorr or less.

The metal pattern 31 is arranged to cover the ferroelectric capacitors 20 sufficiently, and the occupied area of this pattern varies in response to the area of the memory cell region A. Here, a cell efficiency is defined as $S_1/S_2 \times 100\%$, where $S_1$ being an area of the memory cell and $S_2$ being chip area. When the cell efficiency is 30%, the area of the metal pattern 31 is set to 30% or more.

According to this, the metal pattern 31 is always arranged to cover the entirety of the memory cell region A. Therefore, a rate of the area of the metal pattern 31 to the chip area takes the numerical value higher than the cell efficiency. This is the case for a second embodiment described later. The stress of the multi-layered metal film that consists of the Ti film, the TiN film, the Al—Cu film, and the TiN film constituting the metal pattern 31 and the metal wiring 30 exhibits weak tensile stress of $1 \times 10^8$ dyne/cm$^2$ immediately after the formation of the multi-layered metal film. However, after such multi-layered metal film is annealed in vacuum, the tensile stress is changed into $6 \times 10^9$ dyne/cm$^2$ to $1 \times 10^9$ dyne/cm$^2$ and shows the stronger stress in the tensile direction than that obtained immediately after the film formation. Since change in the stress gives the preferable stress to the underlying ferroelectric capacitors 20, the ferroelectric characteristic of the ferroelectric capacitors 20 can be improved.

The TiN film constituting the glue layer 29a and the TiN film 29d has the compressive stress at the initial stage of the film formation, and the Al—Cu film 29c has the tensile stress. Thus, the overall multi-layered metal film exhibits slight tensile stress.

In this case, a specific resistance of the multi-layered metal film is increased by 5 to 10% by the annealing.

In the above example, the metal pattern 31 and the metal wiring 30 are formed by patterning the multi-layered metal film, and then the multi-layered metal film is annealed. However, if the multi-layered metal film is annealed under the above conditions immediately after formation of the multi-layered metal film and then the metal pattern 31 and the metal wiring 30 are formed by patterning the multi-layered metal film, the same stress effect is caused finally in the metal pattern 31 and the metal wiring 30. In other words, unless the process of spoiling the stress in the multi-layered metal film constituting the metal pattern 31 and the metal wiring 30 is executed, the same effect can be expected by annealing the multi-layered metal film at any stage. For example, such annealing may be executed after a first cover film (third insulating film) 32 to be formed in next step is formed.

A potential of the metal pattern 31 is set to a fixed potential or a floating potential that is electrically isolated.

Figure 11:
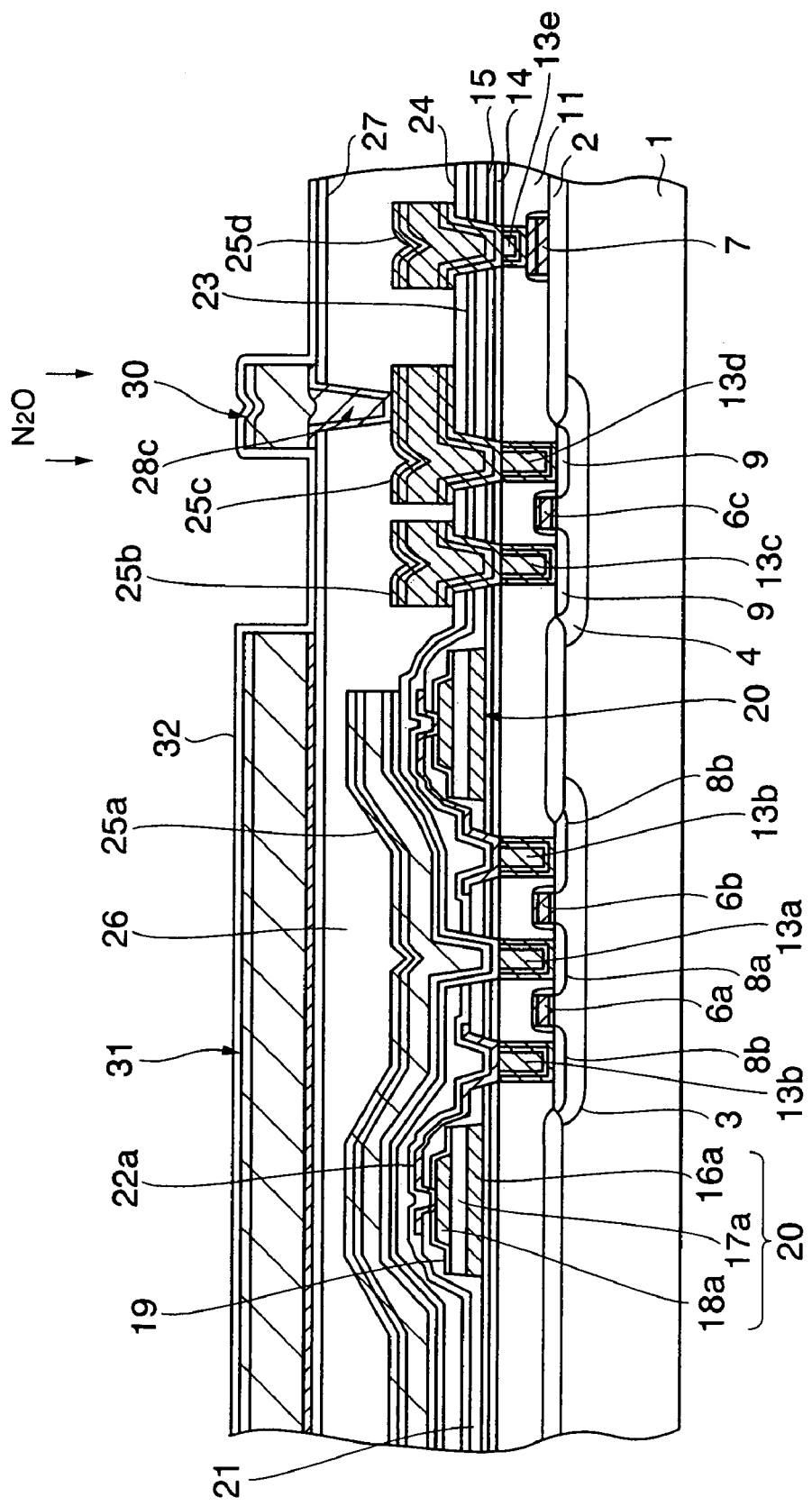

Then, as shown in FIG. 11, the first cover film 32 made of silicon oxide and having a 100 nm thickness is formed on the metal pattern 31, the metal wiring 30, and the re-deposited interlayer insulating film 27 by the plasma CVD method using the TEOS gas. Then, the $N_2O$ plasma process is applied to the first cover film 32. The conditions of this $N_2O$ plasma process are set to the same conditions as the $N_2O$ plasma process applied to the second interlayer insulating film 21.

Figure 12:
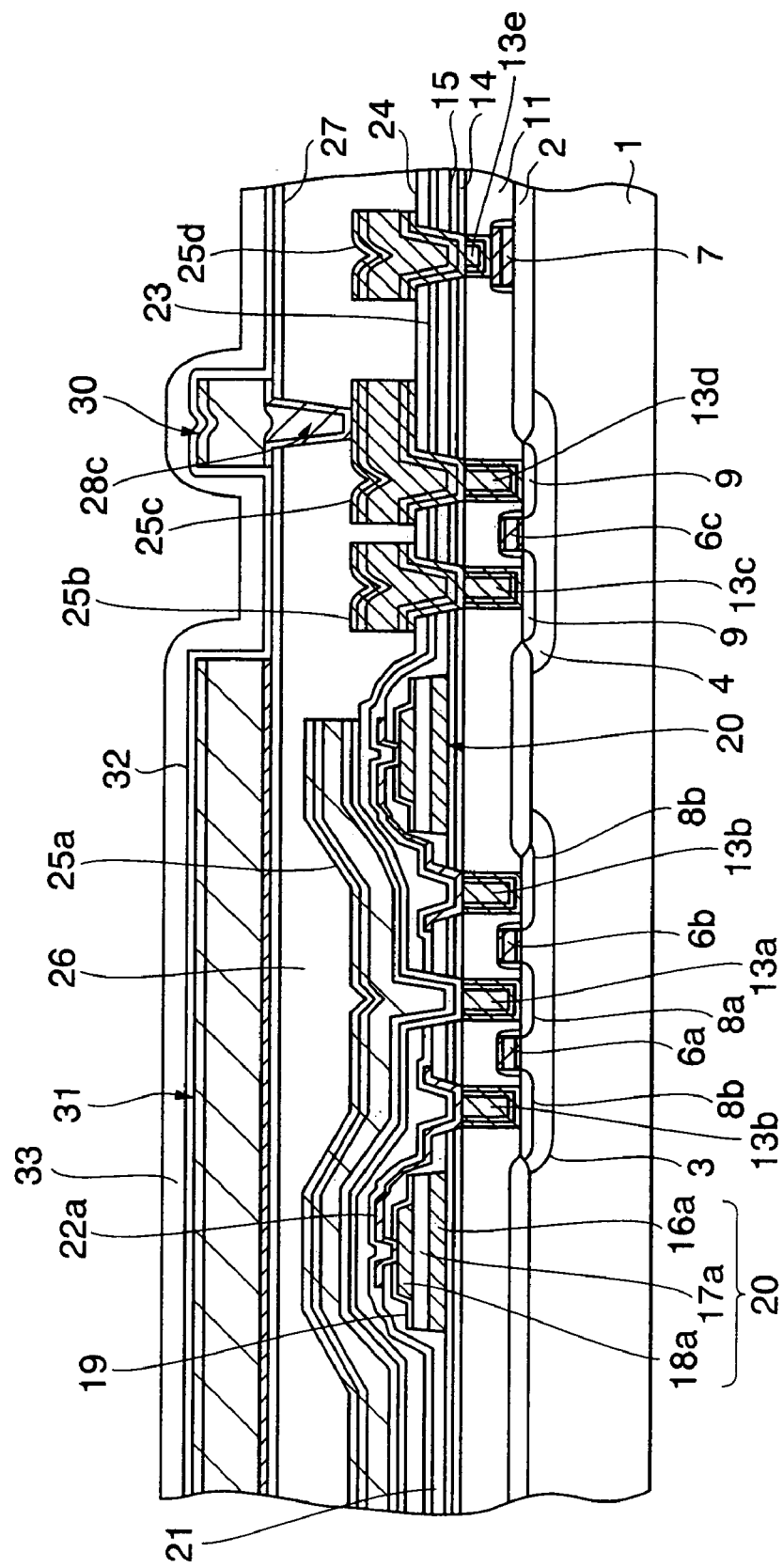

Then, as shown in FIG. 12, a second cover film 33 made of silicon nitride of a 350 nm thickness is formed on the first cover film 32 by the CVD method. Then, the first and second cover films 32, 33 are patterned in the area, which is close to the outermost periphery of the chip area (semiconductor device chip area) of the silicon substrate 1, by the photolithography method. Thus, a hole (not shown) connected to a second-layer aluminum wiring (not shown) is formed.

Figure 13:
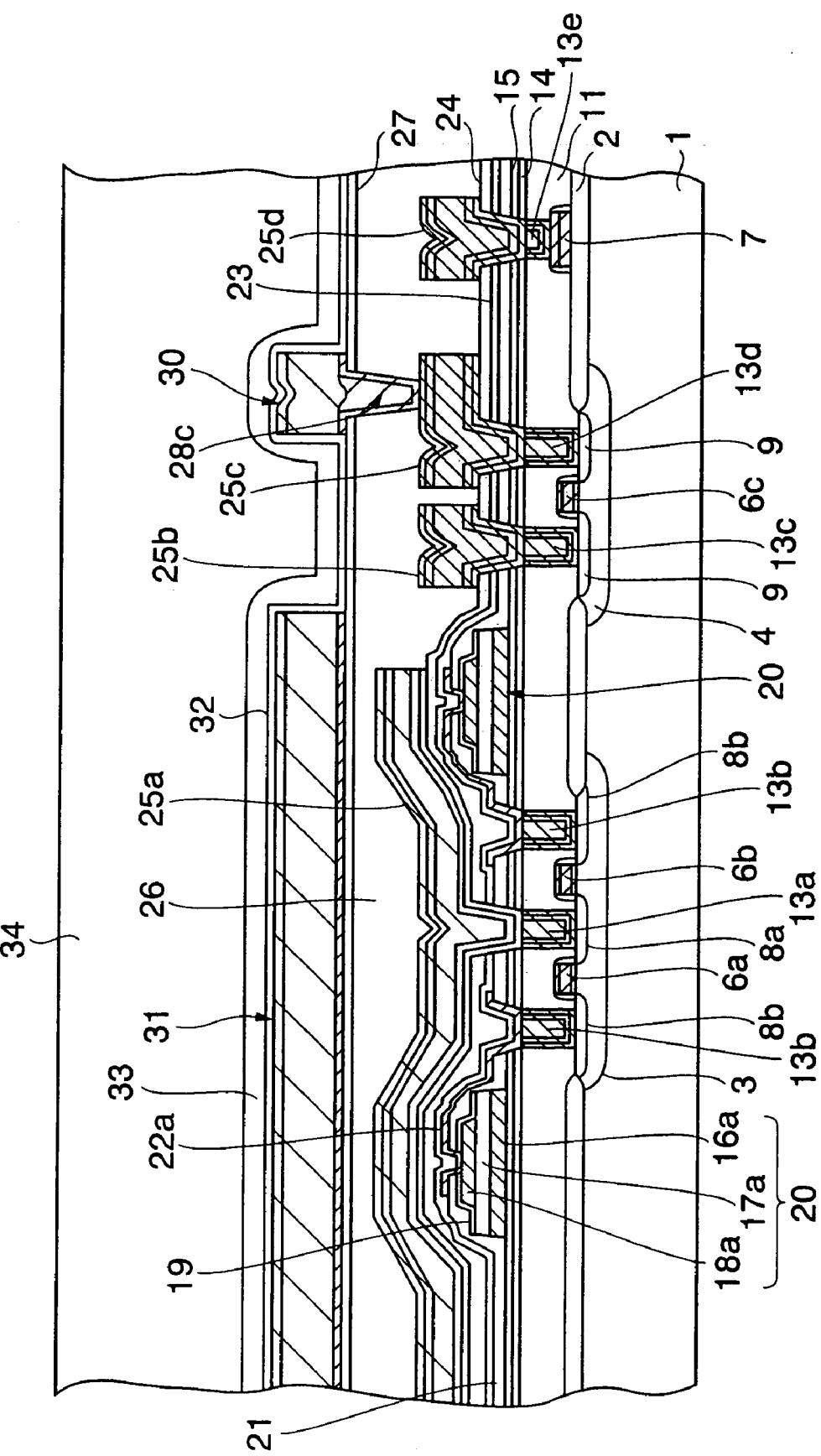
Figure 14:
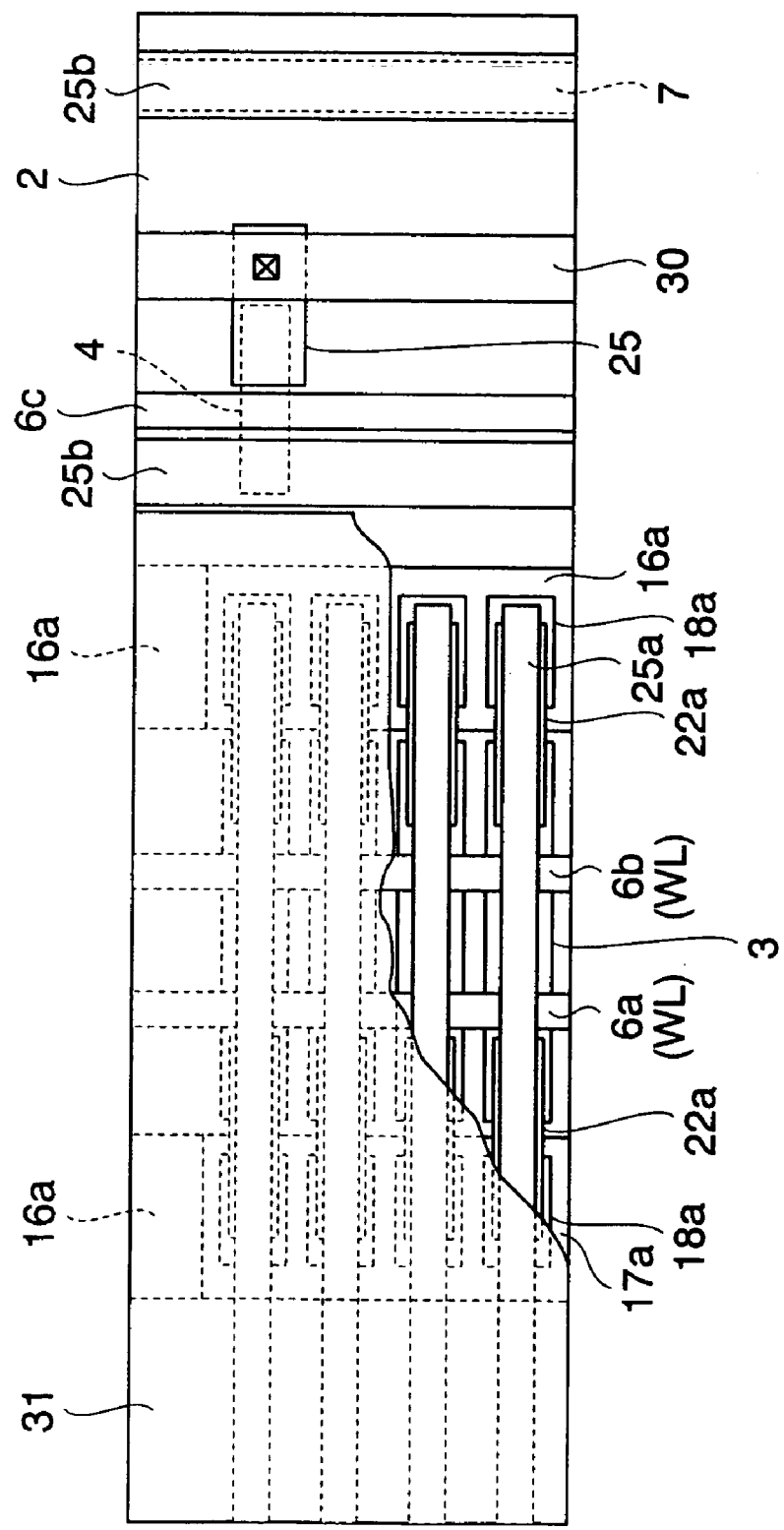
FIG. 14 is a plan view showing the semiconductor device according to the first embodiment of the present invention.

Then, as shown in FIG. 13, a polyimide resin 34 is coated on the second cover film 33 as the measure for the crack generation at the time of packaging. Then, bonding openings (not shown) are formed in the polyimide resin 34. Then, the polyimide resin 34 is cured at the temperature of 250° C. Accordingly, the FeRAM is completed.

In this case, a planar structure of the semiconductor device shown in FIG. 13 is given in FIG. 14. Here, insulating films except the element isolation insulating film 2 are omitted in FIG. 14.

In the above embodiment, the metal pattern 31 having the tensile stress is formed in the area that is located on the re-deposited interlayer insulating film 27, which is formed over the ferroelectric capacitors 20, to cover the entirety of the memory cell region A. According to this, the forces applied to the ferroelectric capacitors 20 from the interlayer insulating films 27, 26, 24 and the cover films 32, 33 having the compressive stress can be relaxed by the metal pattern 31. In addition, since the metal pattern 31 does not desorb the moisture unlike the insulating film, the metal pattern 31 does not deteriorate the ferroelectric capacitors 20.

Figure 15:
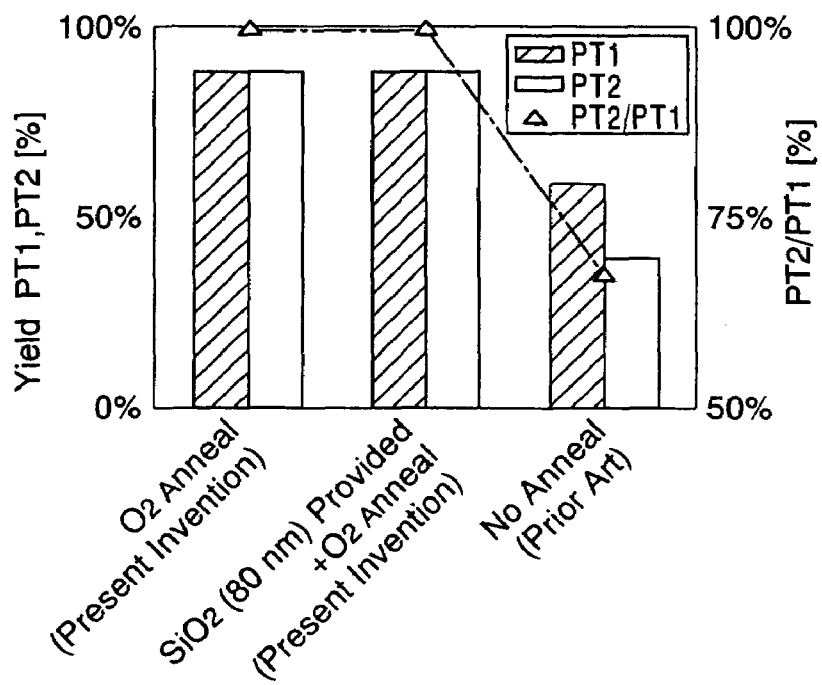
FIG. 15 is a view showing yield of FeRAM according to the first embodiment of the present invention and yield of FeRAM formed in the prior art.

Meanwhile, when yield of FeRAM formed via the step of annealing the multi-layered metal film 29a, 29c, 29d constituting the metal pattern 31 in the oxygen atmosphere and yield of FeRAM formed without such annealing step were examined, results shown in FIG. 15 were obtained.

In FIG. 15, PT1 denotes yield in the quantity of initial production, which was examined by measuring the characteristic of the ferroelectric capacitor at the initial stage of FeRAM formation. Also, PT2 denotes yield in the quantity of initial production, which was examined by measuring the retention and imprint characteristics of the ferroelectric capacitor after the FeRAM was heated at 200° C. for 4 hours.

Also, in FIG. 15, "$O_2$ anneal" denotes the FeRAM formed via the step of annealing the multi-layered metal film constituting the metal pattern 31 in the oxygen atmosphere. Also, "$SiO_2$ provided+$O_2$ anneal" denotes the FeRAM formed via the step of annealing the metal pattern 31 after the $SiO_2$ film of 80 nm thickness is formed as the first cover film 32 on the multi-layered metal film. Also, "no anneal" denotes the FeRAM formed without the step of annealing the multi-layered metal film constituting the metal pattern 31.

According to FIG. 15, in the FeRAMs formed via the step of annealing the multi-layered metal film constituting the metal pattern 31, there was no difference between the yields PT1 and PT2. The products that are good immediately after the manufacture of the FeRAM could still maintain the memory cell characteristics as they are after the annealing executed at 200° C. for 4 hours.

In contrast, it was found that, in the FeRAMs formed without the step of annealing the multi-layered metal film, the yield PT2 is degraded lower than the yield PT1 and also the FeRAM is degraded by the annealing executed at 200° C. for 4 hours.

Figure 16:
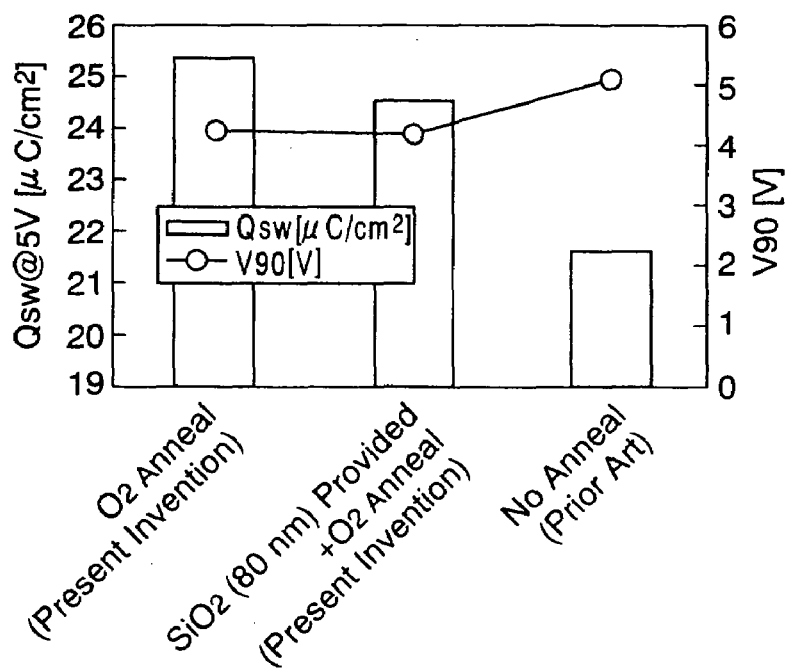
FIG. 16 is a view showing the characteristic of the ferroelectric capacitor in the FeRAM according to the first embodiment of the present invention and the characteristic of the ferroelectric capacitor in the FeRAM formed in the prior art.

Next, when a switching charge $Q_{SW}$ and an accumulated charge saturated voltage V90 of the ferroelectric capacitor immediately after three type FeRAMs employed in FIG. 15 are completed were examined, results shown in FIG. 16 were obtained. In this case, the accumulated charge saturated voltage V90 is the voltage at which the accumulated charge becomes 90% of the saturated value.

According to FIG. 16, it is appreciated that the ferroelectric capacitor characteristics can be improved by annealing the metal film constituting the metal pattern 31.

Then, variation in the stress due to the annealing of the metal film was examined. As the examined sample, the Al—Cu film of 500 nm thickness and the TiN film of 100 nm thickness were formed as the metal film on the $SiO_2$ film that has a 100 nm thickness and covers the silicon substrate. Then, when the change in stress was examined by annealing the metal film, results shown in FIG. 17 were obtained. In this case, as the annealing conditions, the temperature was set to 350° C. in the atmosphere of 2.2 Torr, the annealing time was set to 30 min, 60 min, and 120 min, and one of the oxygen gas and the nitrogen gas was selected as the gas that is introduced into the annealing atmosphere.

Figure 17:
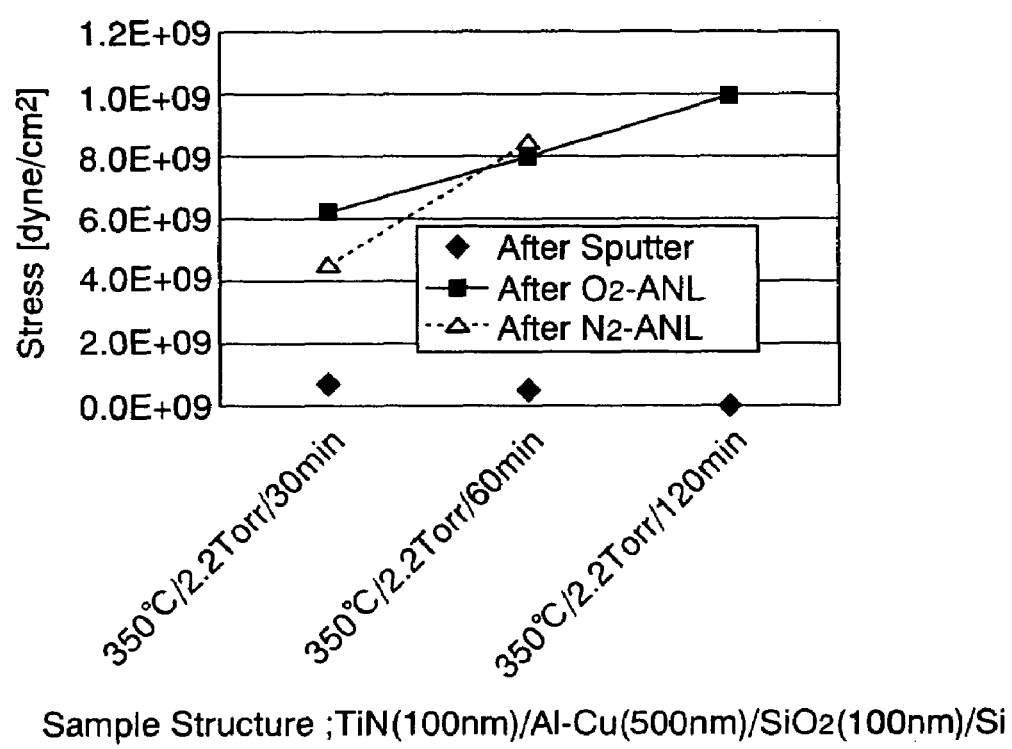
FIG. 17 is a view showing change in the stress by the annealing of the metal film.

In FIG. 17, an abscissa denotes the conditions of the annealing. Also, in FIG. 17, ♦ denotes the no-annealing state that was not annealed under the conditions given by the abscissa.

According to FIG. 17, it was found that, if the metal film is annealed in the reduced-pressure atmosphere into which the oxygen or the nitrogen is introduced, the tensile stress of the metal film containing the aluminum film is increased as the annealing time is lengthened. In other words, the tensile stress can be controlled by the time and thus the optimal value can be selected in response to the magnitude of the compressive stress of the interlayer insulating film.

By the way, in the above embodiment, the metal pattern formed on the re-deposited interlayer insulating film 27 to cover the entirety of the memory cell region A is made of the multi-layered metal film containing the Al—Cu film, but other film except the multi-layered metal film may be employed. That is, as the metal film constituting the metal pattern 31, a film made of any one of aluminum, copper, tungsten, titanium, and tantalum, or a film made of an alloy of any element of them or a mixture of them may be formed. When the aluminum film is formed, it is preferable to make its thickness more than 250 nm. As the example in which the metal pattern 31 is formed of tungsten, the tungsten film 29b constituting the conductive plug 28c may be left selectively on the re-deposited interlayer insulating film 27 in the memory cell region A, then this tungsten film may be used as the metal pattern 31. The copper film has the compressive stress of $-5\times10^{10}$ dyne/cm$^2$ in the initial stage of film formation. But such compressive stress is changed into the tensile stress of $5\times10^{10}$ dyne/cm$^2$ when the copper film is annealed at the temperature of 370° C., for example, in the inert gas atmosphere.

In this case, the annealing of the metal film constituting the metal pattern 31 may be executed in any one of the oxygen atmosphere, the oxygen containing atmosphere, the inert gas atmosphere, and the inert gas containing atmosphere.

Also, if the metal film is heated in the annealing to exceed the melting point, such metal film does not generate the desired stress. Therefore, the annealing temperature must be set to less than the melting point of the metal film.

Second Embodiment

The present invention can be applied to the damascene process. Such application of the present invention will be explained hereunder.

FIG. 18A to FIG. 32 are sectional views showing a manufacturing method of a semiconductor device according to a second embodiment of the present invention in order of step. In this embodiment, a stacked FeRAM will be explained hereunder. But the present invention is not limited to this embodiment, and can be applied to the planar FeRAM.

Figure 18A:
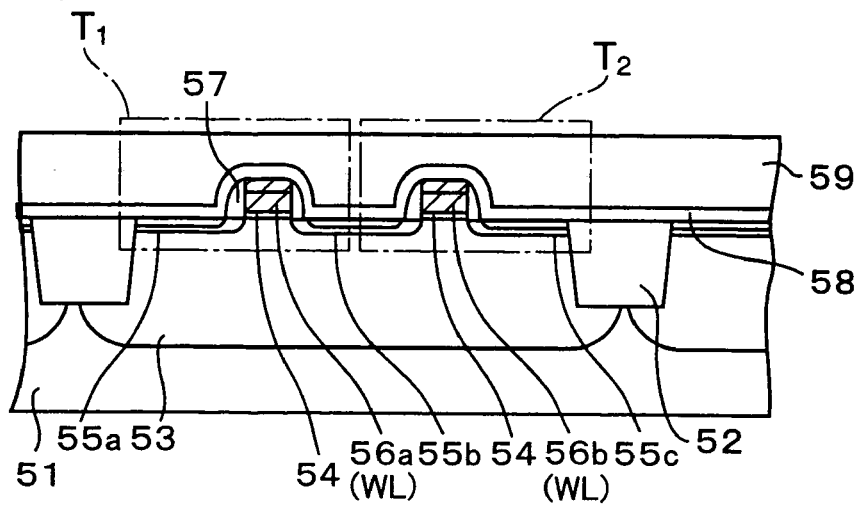
FIGS. 18A to 18C, FIGS. 19A to 19C, FIGS. 20A to 20C, FIGS. 21A and 21B, FIGS. 22A and 22B, FIGS. 23A and 23B, FIGS. 24A and 24B, FIGS. 25A and 25B, FIGS. 26A and 26B, FIG. 27, FIG. 28, FIG. 29, FIG. 30, FIG. 31, and FIG. 32 are sectional views showing steps of forming a semiconductor device according to a second embodiment of the present invention.

First, steps required until a sectional structure shown in FIG. 18A is formed will be explained hereunder.

As shown in FIG. 18A, an element isolation recess is formed around the transistor forming region of an n-type silicon (semiconductor) substrate 51 by the photolithography method, and then an STI element isolation insulating film 52 is formed by burying silicon oxide (SiO$_2$) in the recess. In this case, the insulating film formed by the LOCOS method may be employed as the element isolation insulating film 52.

Then, a p-well 53 is formed by selectively introducing the p-type impurity into the predetermined transistor forming region of the silicon substrate 51. Then, a silicon oxide film serving as a gate insulating film 54 is formed by thermally oxidizing a surface of the p-well 53 of the silicon substrate 51.

Then, an amorphous silicon or polysilicon film and a tungsten silicide film are formed sequentially on the overall upper surface of the silicon substrate 51. Then, gate electrodes 56a, 56b are left on the gate insulating film 54 by patterning the silicon film and the tungsten silicide film by virtue of the photolithography method. In this case, these gate electrodes 56a, 56b constitute a part of the word line (WL).

Then, the b-type impurity, e.g., phosphorus is ion-implanted into the p-well 53 on both sides of the gate electrodes 56a, 56b. Thus, first to third n-type impurity diffusion-regions 55a to 55c are formed as the source/drain. Then, an insulating film, e.g., a silicon oxide (SiO$_2$) film is formed on the overall surface of the silicon substrate 51 by the CVD method. Then, insulating sidewalls 57 are left on both side portions of the gate electrodes 56a, 56b by etching back the insulating film.

Then, the n-type impurity is ion-implanted again into the first to third n-type impurity diffusion regions 55a to 55c while using the gate electrodes 56a, 56b and the sidewalls 57 as a mask. Thus, high-concentration impurity regions are formed in the first to third n-type impurity diffusion regions 55a to 55c respectively, so that the first to third n-type impurity diffusion regions 55a to 55c have the LDD (Lightly Doped Drain) structure respectively.

The first and third n-type impurity diffusion regions 55a, 55c out of the above diffusion regions are connected electrically to the capacitor lower electrodes described later, while the second n-type impurity diffusion region 55b is connected electrically to the bit line described later.

According to the above steps, two n-type MOS transistors $T_1$, $T_2$ having the gate electrodes 56a, 56b and the n-type impurity diffusion regions 55a to 55c are formed on the p-well 53 to have one n-type impurity diffusion region 55b commonly.

Then, as a cover insulating film 58 for covering the MOS transistors $T_1$, $T_2$, a silicon oxide nitride (SiON) film of about 200 nm thickness is formed on the overall surface of the silicon substrate 51 by the plasma CVD method. Then, a silicon oxide (SiO$_2$) film of about 1.0 μm thickness is formed as an underlying insulating film 59 on the cover insulating film 58 by the plasma CVD method using the TEOS gas.

Then, an upper surface of the underlying insulating film 59 is planarized by the chemical mechanical polishing (CMP) method. Then, the densification and the dehydrating process of the underlying insulating film 59 are carried out by annealing such underlying insulating film 59 at about 650° C. for about 30 minute in the N$_2$ atmosphere.

Figure 18B:
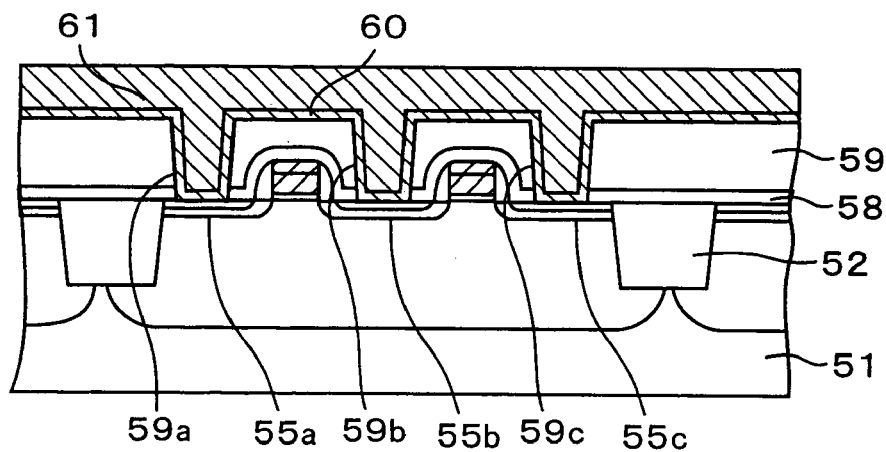

Next, steps required until a structure shown in FIG. 18B is obtained will be explained hereunder.

First, the cover insulating film 58 and the underlying insulating film 59 are patterned by the photolithography method. Thus, contact holes 59a to 59c reaching the first to third n-type impurity diffusion regions 55a to 55c respectively are formed.

Then, a titanium (Ti) film of about 20 nm thickness and a titanium nitride (TiN) film of about 50 nm thickness are formed as a glue film 60 in this order on an upper surface of the underlying insulating film 59 and inner surfaces of the contact holes 59a to 59c by the sputter method. Then, a tungsten (W) film 61 is grown on the glue film 60 to bury completely insides of the contact holes 59a to 59c by the CVD method using tungsten hexafluoride (WF$_6$).

Figure 18C:
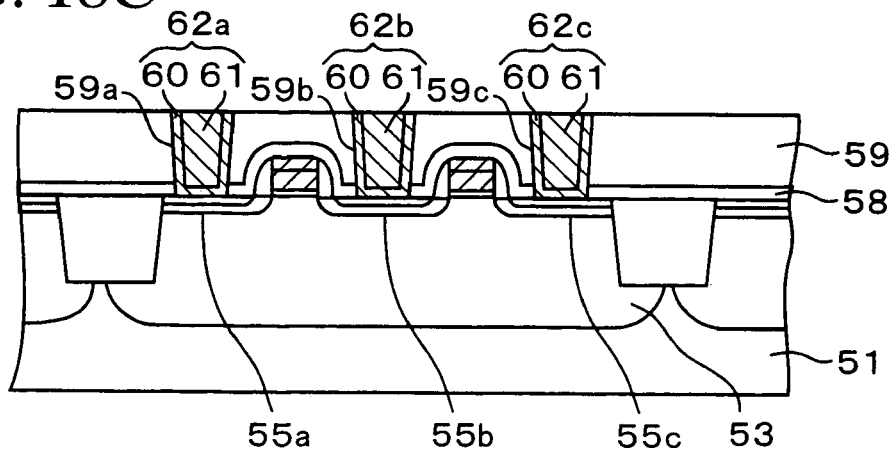

Then, as shown in FIG. 18C, the tungsten film 61 and the glue film 60 are polished selectively by the CMP method while using the underlying insulating film 59 as a polishing stopper film to remove from the upper surface of the underlying insulating film 59. Thus, the tungsten film 61 and the glue film 60 are left in the contact holes 59a to 59c as first conductive plugs 62a, 62c and a second conductive plug 62b.

Figure 19A:
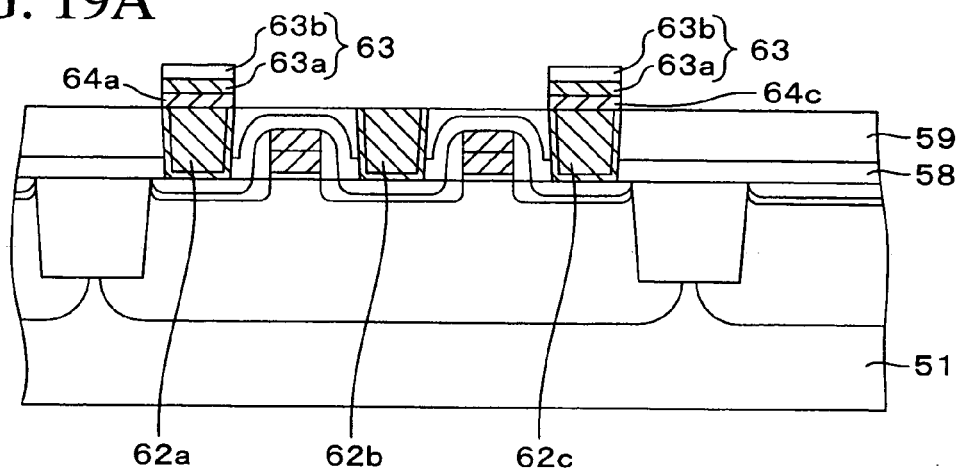

Next, steps required until a sectional structure shown in FIG. 19A is obtained will be explained hereunder.

First, an Ir film is formed on the overall surface by the sputter method to have a thickness of about 200 to 400 nm, e.g., 250 nm. Then, a TiN film 63a is formed on the Ir film by the sputter method to have a thickness of about 200 to 400 nm, e.g., 200 nm. Then, an SiO$_2$ film 63b is formed on the TiN film 63a by the plasma CVD method using the TEOS to have a thickness of about 800 to 900 nm, e.g., 800 nm. Then, a resist pattern (not shown) is formed on the SiO$_2$ film 63b. Then, hard masks 63 are formed by patterning the SiO$_2$ film 63b and the TiN film 63a while using the resist pattern as an etching mask.

Then, the silicon substrate 51 is put on the lower electrode in the etching chamber (not shown). Then, the bias voltage is applied to the silicon substrate 51 by applying the bias high-frequency power of 700 W having a frequency of 600 kHz to the lower electrode. Then, the high-frequency power of 800 W having a frequency of 13.56 MHz is applied as the antenna power to the coil provided around the chamber. Also, HBr, $O_2$, and $C_4F_8$ are introduced in the chamber at flow rates of 10 sccm, 40 sccm, and 5 sccm respectively to hold the pressure in the chamber at 0.4 Pa, and the substrate temperature is set to 400° C. As a result, the Ir etching atmosphere is set in the interior of the chamber. In this case, the reason why $C_4F_8$ is added to the etching atmosphere as described above is to stabilize the etching process.

Since the hard masks 63 have the etching resistance against the above etching atmosphere, such hard masks 63 function as the etching mask and thus the underlying Ir film is etched/patterned selectively. As a result, conductive oxygen barrier films 64a, 64c made of the Ir film are left selectively on the first conductive plugs 62a, 62c.

Since the conductive oxygen barrier films 64a, 64c are made of the Ir film that is excellent in the oxygen-penetration preventing capability, such a situation that the underlying first conductive plugs 62a, 62c are oxidized in various steps executed later to cause the defective contact can be prevented.

Figure 19B:
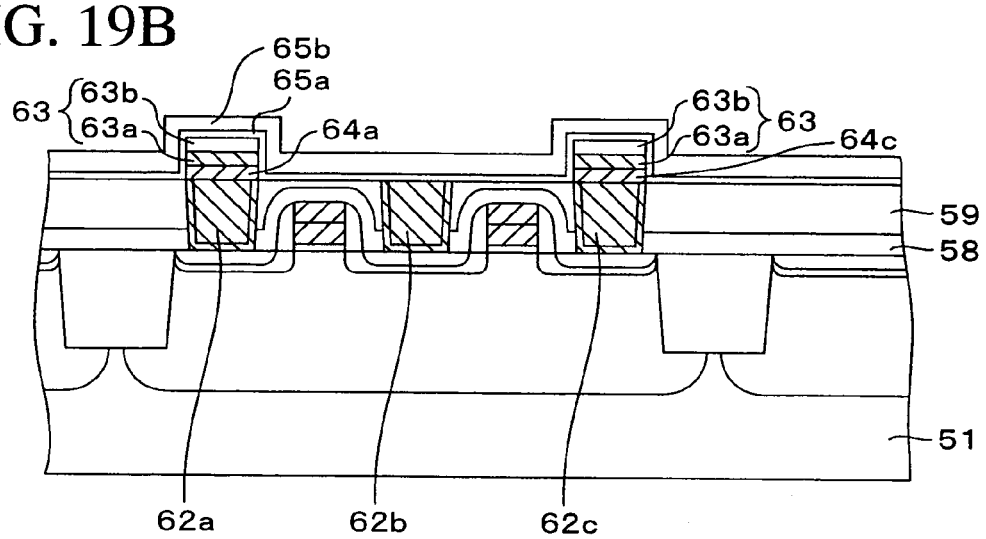

Next, steps required until a sectional structure shown in FIG. 19B is obtained will be explained hereunder.

First, an SiON film of about 100 nm thickness is formed as an oxidation preventing insulating film 65a on the overall surface by the plasma CVD method. Then, an $SiO_2$ film of about 400 nm thickness is formed as an insulating adhesive film 65b on the oxidation preventing insulating film 65a by the plasma CVD method using TEOS.

Figure 19C:
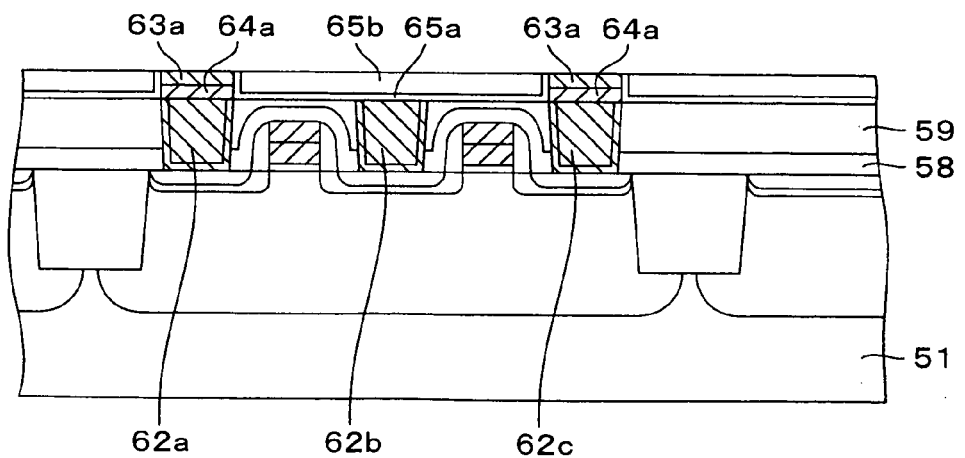

Then, the polishing is applied from an upper surface of the insulating adhesive film 65b by the CMP method until such polishing is stopped on a surface of the TiN film 63a. Thus, as shown in FIG. 19C, the $SiO_2$ film 63b is removed and thus the surface of the TiN film 63a is exposed.

Figure 20A:
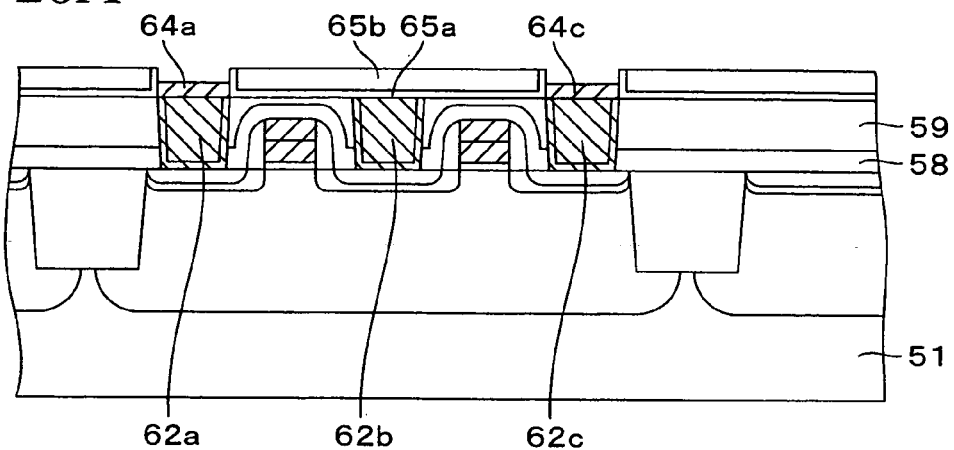

Then, as shown in FIG. 20A, the TiN film 63a is removed by exposing the exposed TiN film 63a to the ammonia peroxide aqueous solution.

Figure 20B:
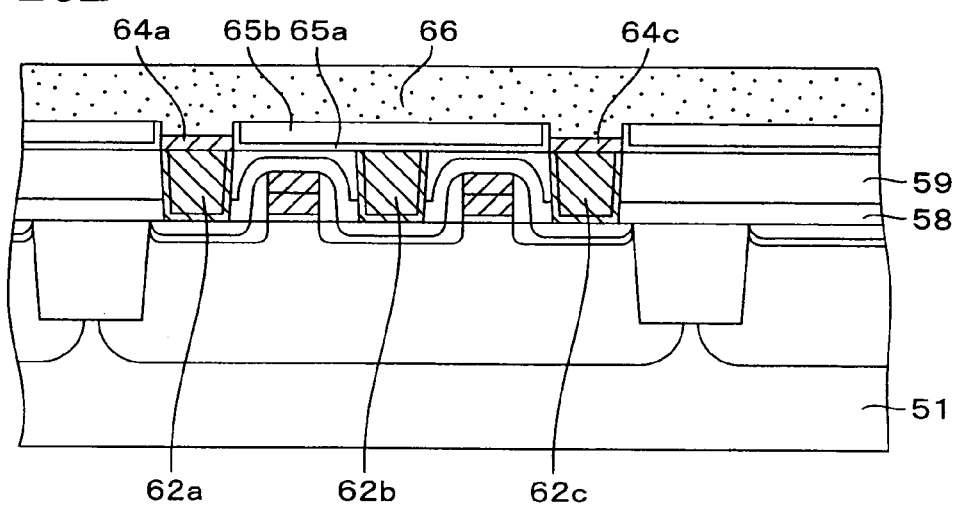
Figure 20C:
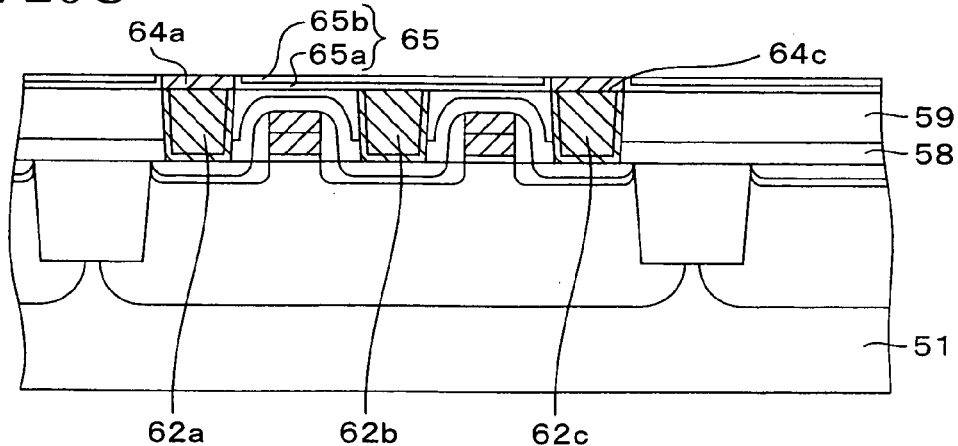

Then, as shown in FIG. 20B, a resist is coated as a sacrifice film 66 on the overall surface to have a thickness of about 1000 nm. As such resist, the resist whose etching rate is almost identical to etching rates of the oxidation preventing insulating film 65a and the insulating adhesive film 65b is employed. The etched surface is lowered as the flat surface by etching back such sacrifice film 66 by virtue of the plasma etching. Then, as shown in FIG. 20C, the flat upper surface of the sacrifice film 66 prior to the etching-back is transferred onto the oxidation preventing insulating film 65a and the insulating adhesive film 65b after the end of the etching-back. Then, the remaining oxidation preventing insulating film 65a and the remaining insulating adhesive film 65b are used as an insulating oxygen barrier film 65.

As has already been described, the oxidation preventing insulating film 65a of the insulating oxygen barrier film 65 is made of the SiON film and has a role of preventing the underlying second conductive plug 62b from being oxidized by various annealing processes.

Figure 21A:
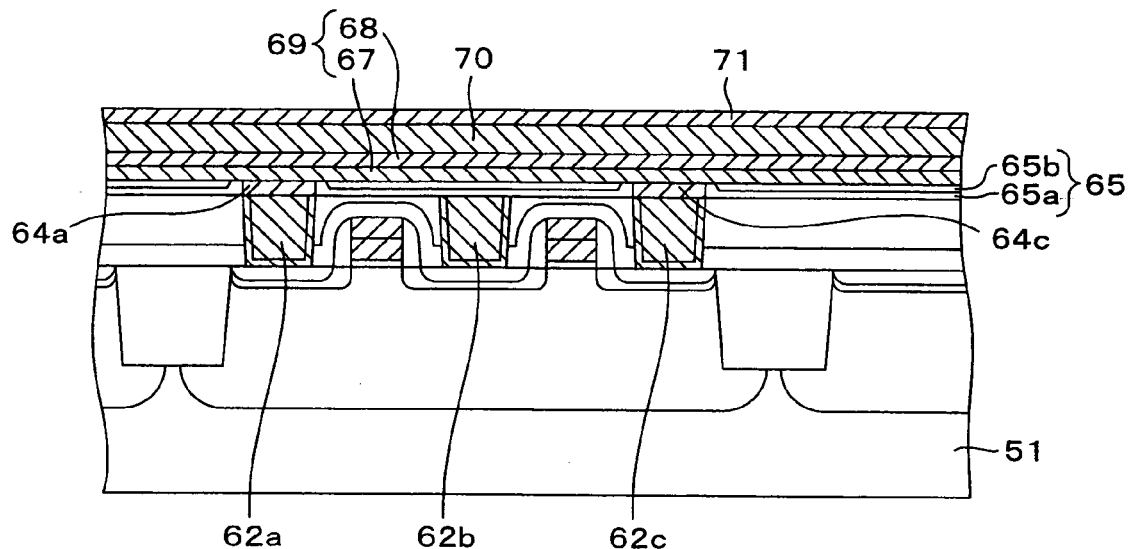

Next, steps required until a sectional structure shown in FIG. 21A is obtained will be explained hereunder.

First, an Ir film and an $IrO_2$ film are formed in this order as an $IrO_2/Ir$ film 67 on the overall surface by the sputter method to have a thickness of about 200 nm and a thickness of about 30 nm respectively. The lowermost Ir film of the $IrO_2/Ir$ film 67 functions to prevent the oxidation of the underlying first conductive plug 62a and prevent the degradation of its contact characteristic.

Then, a PtO film and a Pt film are formed in this order as a Pt/PtO film 68 on the $IrO_2/Ir$ film 67 by the sputter method to have a thickness of about 30 nm and a thickness of about 50 nm respectively. The Pt film of the Pt/PtO film 68 fulfills a role of uniformly aligning the orientation of the ferroelectric film formed thereon later.

Then, the $IrO_2/Ir$ film 67 and the Pt/PtO film 68 are used as a lower electrode conductive film 69.

In this case, in order to prevent the peeling-off of the film, for example, the insulating adhesive film 65b may be annealed before or after the lower electrode conductive film 69. As the annealing method, the RTA executed at 750° C. for 60 second in the argon atmosphere, for example, may be employed.

Then, a PZT film of about 180 nm thickness is formed as a ferroelectric film 70 on the lower electrode conductive film 69 by the sputter method. As the film forming method of the ferroelectric film 70, there are the MOD method, the MOCVD method, the sol-gel method, etc. in addition to the sputter method. Also, as the material of the ferroelectric film 70, other PZT material such as PLCSZT, PLZT, etc., Bi-layered structure compound material such as $SrBi_2Ta_2O_9$, $SrBi_2(Ta,Nb)_2O_9$, etc., and other metal oxide ferroelectric substance may be employed in addition to PZT. In addition, if the DRAM is to be formed, the high-dielectric material such as $(BaSr)TiO_3$ (BST), strontium titanate (STO), etc. may be used in place of the above ferroelectric material.

Then, the ferroelectric film 70 is crystallized by executing the annealing in the oxygen-containing atmosphere. As the annealing process, two-step RTA process having the first step executed at the substrate temperature of 600° C. for a time of 90 second in the mixed gas atmosphere consisting of Ar and $O_2$, and the second step executed at the substrate temperature of 750° C. for a time of 60 second in the oxygen atmosphere, for example, is employed.

Then, an $IrO_2$ film of 200 nm thickness, for example, is formed as an upper electrode conductive film 71 on the ferroelectric film 70 by the sputter method. Then, in order to recover the damage of the ferroelectric film 70 caused at the time of formation of the upper electrode conductive film 71, the annealing is executed for about 60 minute in the furnace (not shown) that is set to 650° C. in the oxygen atmosphere.

Figure 21B:
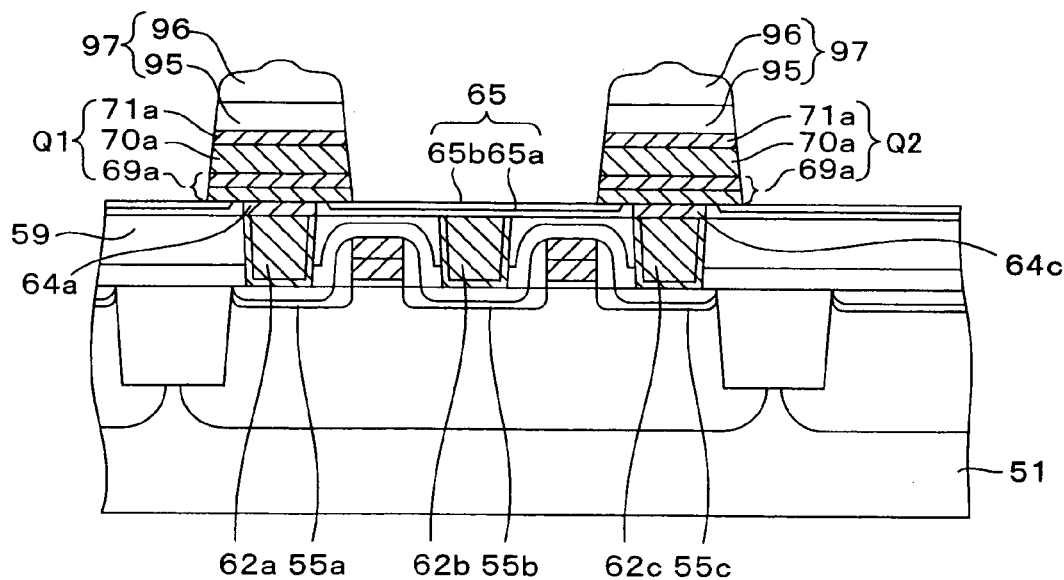

Next, steps required until a sectional structure shown in FIG. 21B is obtained will be explained hereunder.

First, a TiN film 95 is formed on the upper electrode conductive film 71 by the sputter method, and then a $SiO_2$ film 96 is formed thereon by the plasma CVD method using the TEOS. Then, hard masks 97 are formed by patterning the TiN film 95 and the $SiO_2$ film 96 into a capacitor shape by virtue of the photolithography method.

Then, the silicon substrate 51 is loaded on the lower electrode in the etching chamber (not shown). Then, the bias voltage is applied to the silicon substrate 51 by applying the bias high-frequency power of 700 W having a frequency of 600 kHz to the lower electrode. Then, the high-frequency power of 800 W having a frequency of 13.56 MHz is applied as the antenna power to the coil provided around the chamber. Also, HBr and $O_2$ are introduced in the chamber at flow rates of 10 sccm and 40 sccm respectively to hold the pressure in the chamber at 0.4 Pa, and the substrate temperature is set to 400° C. As a result, the $IrO_2$ etching atmosphere is set in the interior of the chamber, and the upper electrode conductive film 71 made of $IrO_2$ is etched. Then, if the etching is ended when 10% over-etching of the upper electrode conductive film 71 is attained, the upper electrode conductive film 71 is etched into the shape of the hard mask 97 to form an upper electrode 71a. In this case, the "10% over-etching" signifies that the upper electrode conductive film 71 is excessively etched only by 10% of a film thickness 200 nm of the upper electrode conductive film 71, i.e., a 20 nm thickness.

Then, the inside of the chamber is changed to the PZT etching atmosphere by changing the etching gas into a gas consisting of 40 sccm $Cl_2$ and 10 sccm Ar while maintaining the bias power and the antenna power as they are. Then, the ferroelectric film 70 is etched into the shape of the hard mask 97. Then, the etching is stopped on the lower electrode conductive film 69 by monitoring an end point of the etching by means of an end point detector. Thus, the ferroelectric film 70 is etched to form a capacitor dielectric film 70a.

Then, the etching of the lower electrode conductive film 69 is started after the etching gas is set once again to the gas consisting of 10 sccm HBr and 40 sccm $O_2$. Then, the etching is ended when the 10% over-etching is attained. Thus, the lower electrode conductive film 69 is etched into the shape of the hard mask 97 to form a lower electrode 69a.

According to these steps, ferroelectric capacitors Q1, Q2 which are formed by laminating the lower electrode 69a, the ferroelectric film 70a, and the upper electrode 71a in this order are formed on the underlying insulating film 59 via the conductive oxygen barrier films 64a, 64c and the insulating oxygen barrier film 65. The ferroelectric capacitors Q1, Q2 are connected electrically to the first n-type impurity diffusion region 55a and the third n-type impurity diffusion region 55c via the conductive oxygen barrier films 64a, 64c and the first conductive plugs 62a, 62c respectively.

A part of the ferroelectric capacitors Q1, Q2 is formed on the insulating oxygen barrier film 65. However, since the uppermost layer of the insulating oxygen barrier film 65 is formed by the insulating adhesive film 65b made of $SiO_2$, it can be prevented that the lower electrodes 69a of the ferroelectric capacitors Q1, Q2 are peeled off from the insulating oxygen barrier film 65.

Then, in order to recover the damage of the dielectric film 70a caused by the etching, the recovery annealing is carried out. The recovery annealing in this case is executed at the substrate temperature of 650° C. for 60 minute in the furnace containing the oxygen, for example.

Even if such recovery annealing is carried out, the oxidation of the second conductive plug 62b can be prevented by the insulating oxygen barrier film 65 and also the oxidation of the first conductive plugs 62a, 62c can be prevented by the conductive oxygen barrier films 64a, 64c. In this case, the hard masks 97 are removed after the ferroelectric capacitors Q1, Q2 are formed.

Figure 22A:
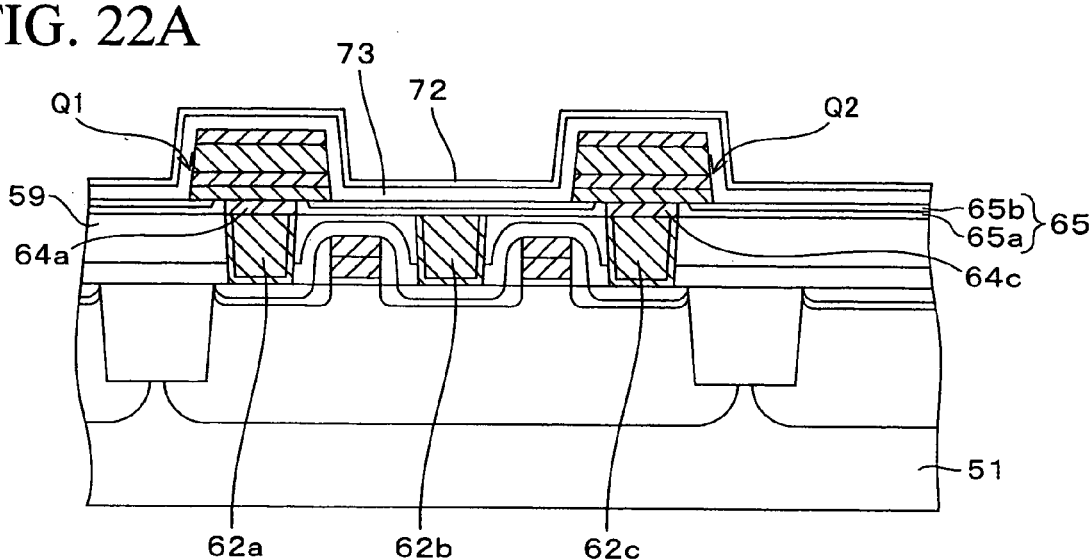

Then, as shown in FIG. 22A, an alumina film of about 50 nm thickness is formed as a first capacitor protection insulating film 73 on the ferroelectric capacitors Q1, Q2 and the insulating oxygen barrier film 65 by the sputter method. This first capacitor protection insulating film 73 protects the ferroelectric capacitors Q1, Q2 from the process damage, and may be formed of PZT in addition to the alumina.

Then, an $SiO_2$ film of about 100 nm thickness is formed as a second capacitor protection insulating film 72 on the first capacitor protection insulating film 73 by the plasma CVD method using the TEOS.

Figure 22B:
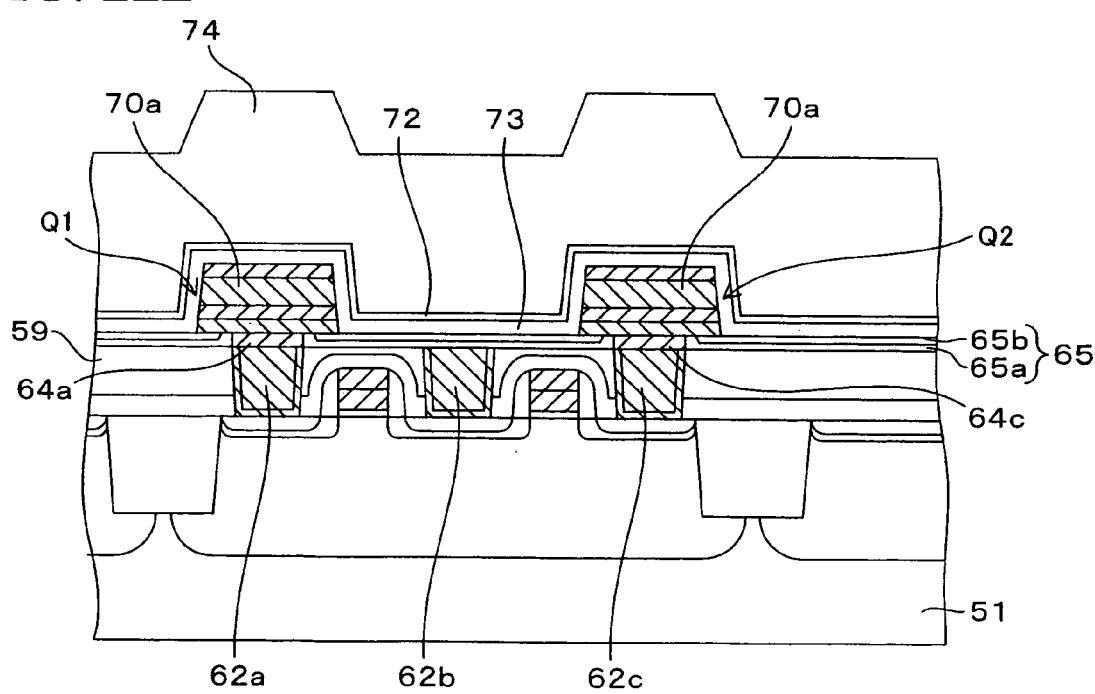

Then, as shown in FIG. 22B, a first insulating film 74 made of $SiO_2$ and having a thickness of about 1.5 μm is formed on the second capacitor protection insulating film 72 by the HDPCVD (High Density Plasma CVD) method using $SiH_4$. According to such HDPCVD method, because the bias voltage is applied to the silicon substrate 51, the first insulating film 74 with the good burying property can be formed between the ferroelectric capacitors Q1, Q2 having a high aspect ratio without the generation of voids.

However, since $SiH_4$ having the hydrogen with the reducing property is used as the reaction gas in the above HDPCVD method, it is possible that the dielectric film 70a is degraded by the hydrogen. For this reason, it is preferable that the hydrogen in the atmosphere should be oxidized as much as possible by supplying $O_2$ 5 times or more of $SiH_4$ at a flow rate to prevent the degradation of the dielectric film 70a due to the hydrogen as much as possible.

Also, although the reason is not known apparently, if the second capacitor protection insulating film 72 is formed by the plasma CVD method using the TEOS, the degradation of the ferroelectric capacitors Q1, Q2 can be prevented more surely than the case where the first capacitor protection insulating film 73 is employed as a single layer.

Figure 23A:
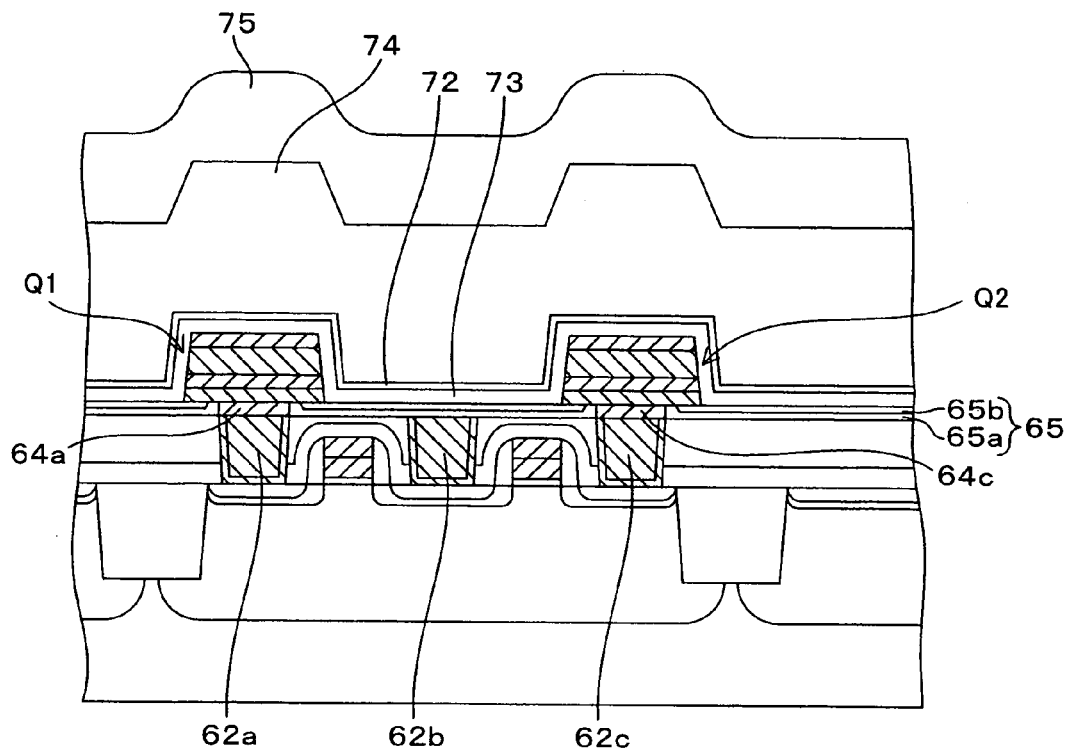

Then, as shown in FIG. 23A, an $SiO_2$ film of about 500 nm thickness is formed as a CMP sacrifice film 75 on the first insulating film 74 by the plasma CVD method using the TEOS.

Figure 23B:
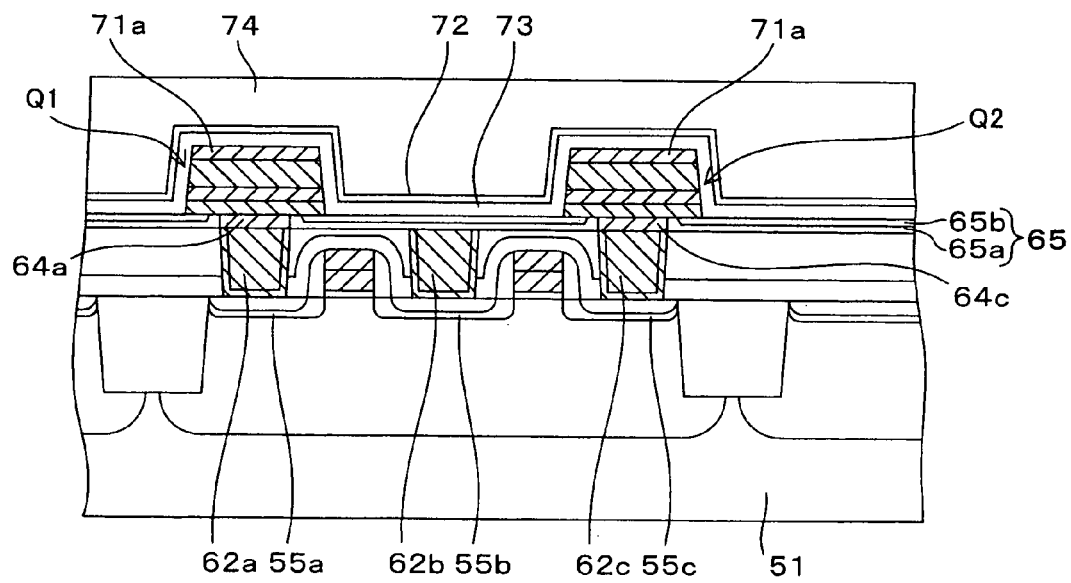

Then, as shown in FIG. 23B, a surface of the first insulating film 74 is planarized by polishing the sacrifice film 75 by means of the CMP. Thus, a thickness of the first insulating film 74 on the upper electrode 71a is set to about 500 mm.

Figure 24A:
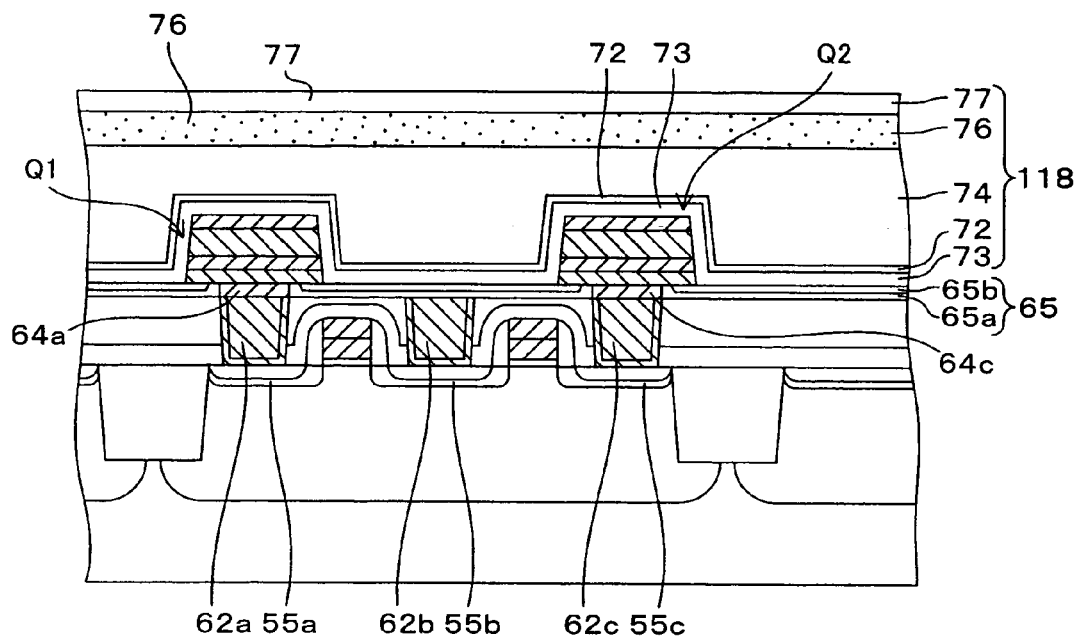

Then, as shown in FIG. 24A, a BN film (dielectric constant: about 2) of about 200 nm thickness is formed as a first low dielectric constant insulating film 76 on the planarized first insulating film 74.

The first low dielectric constant insulating film 76 is formed on the planarized first insulating film 74 without the level difference by the wiring. Thus, the method that is capable of providing the good burying property, e.g., the HDPCVD method in which the substrate bias voltage is applied, is not needed as the film forming method. Therefore, the above BN film can be formed in the condition that the bias voltage is not applied the silicon substrate 51 (non bias), e.g., such film can be formed by the non-bias plasma CVD method using $B_2H_6$ and $N_2$ as the reaction gas.

Because of non-bias, the hydrogen in the film forming gas is never pulled into the silicon substrate 51 by the bias voltage. Thus, such a situation can be prevented that the ferroelectric capacitors Q1, Q2 are deteriorated by the hydrogen.

Here, as the low dielectric constant insulating film 76, the film formed by the SOL-GEL method may be used in addition to the BN film. In this case, it is preferable that a block film (not shown) for blocking the degas from the first low dielectric constant insulating film 76 should be formed on the first insulating film 74 and then the first low dielectric constant insulating film 76 should be formed on this block film. As such block film, an SiN film, an $SiO_2$ film, an SiC film, a $TiO_x$ film, etc. formed by the Cat-CVD (Catalytic Chemical Vapor Deposition) method, for example, may be listed.

Then, an $SiO_2$ film of 100 nm thickness is formed as a first cap film 77 on the first low dielectric constant insulating film 76 by the plasma CVD method using the TEOS. This first cap film 77 performs a role of preventing the upward diffusion of the degas from the first low dielectric constant insulating film 76. In this case, various films formed by the above Cat-CVD method may be used as the first cap film 77. Then, because this first cap film 77 is also formed on the flat surface, there is no necessity that such film must be formed by the HDPCVD method.

According to these steps, a first interlayer insulating film 118 consisting of the insulating films 72 to 74, 76, 77 is formed to cover the ferroelectric capacitors Q1, Q2.

Figure 24B:
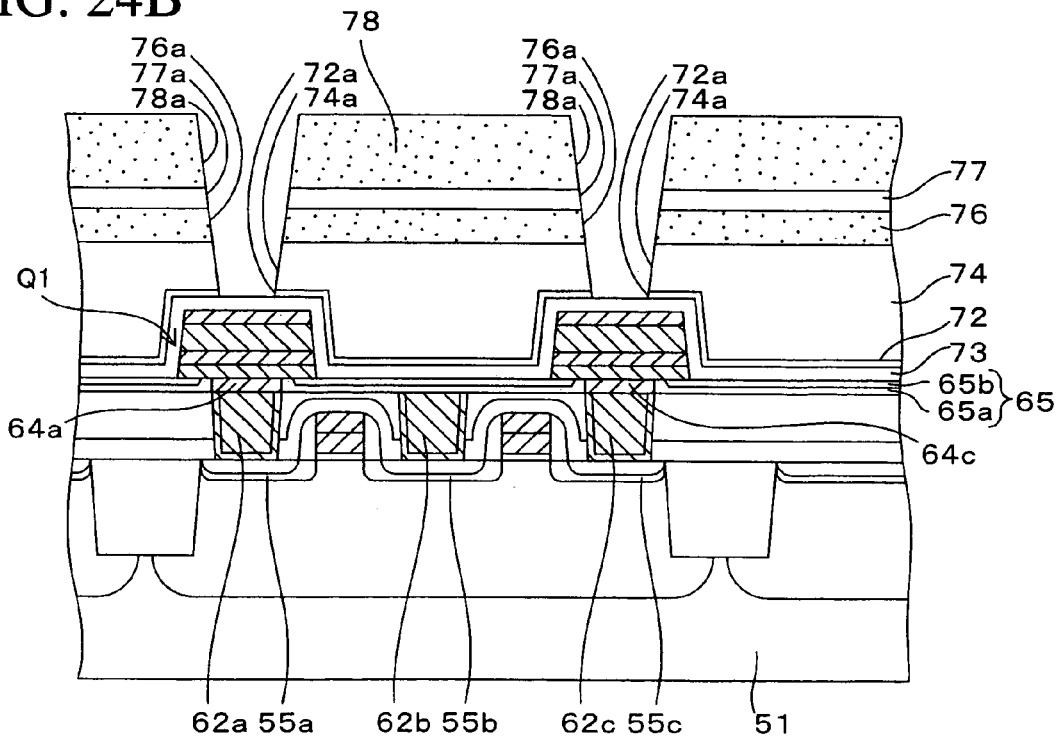

Next, steps required until a sectional structure shown in FIG. 24B is obtained will be explained hereunder.

First, a photoresist is coated on the first cap film 77, and then a first resist pattern 78 having resist openings 78a like the hole shape is formed by exposing/developing the photoresist. Then, the first cap film 77, the first low dielectric constant insulating film 76, the first insulating film 74, and the second capacitor protection insulating film 72 are etched while using the first resist pattern 78 as the etching mask, and thus first holes 72a, 74a, 76a, 77a are formed in respective films.

As the etching gas in this case, a mixed gas consisting of $CF_4$, $C_4F_8$, $O_2$ and Ar, for example, is used.

Since the selective etching ratio of alumina to $SiO_2$ in this etching is given as (alumina):($SiO_2$)=1:about 2 to 3, the first capacitor protection insulating film 73 made of alumina fulfills the role of the etching stopper film in this etching.

After this etching is ended, the first resist pattern 78 is removed by the ashing using the oxygen plasma.

Figure 25A:
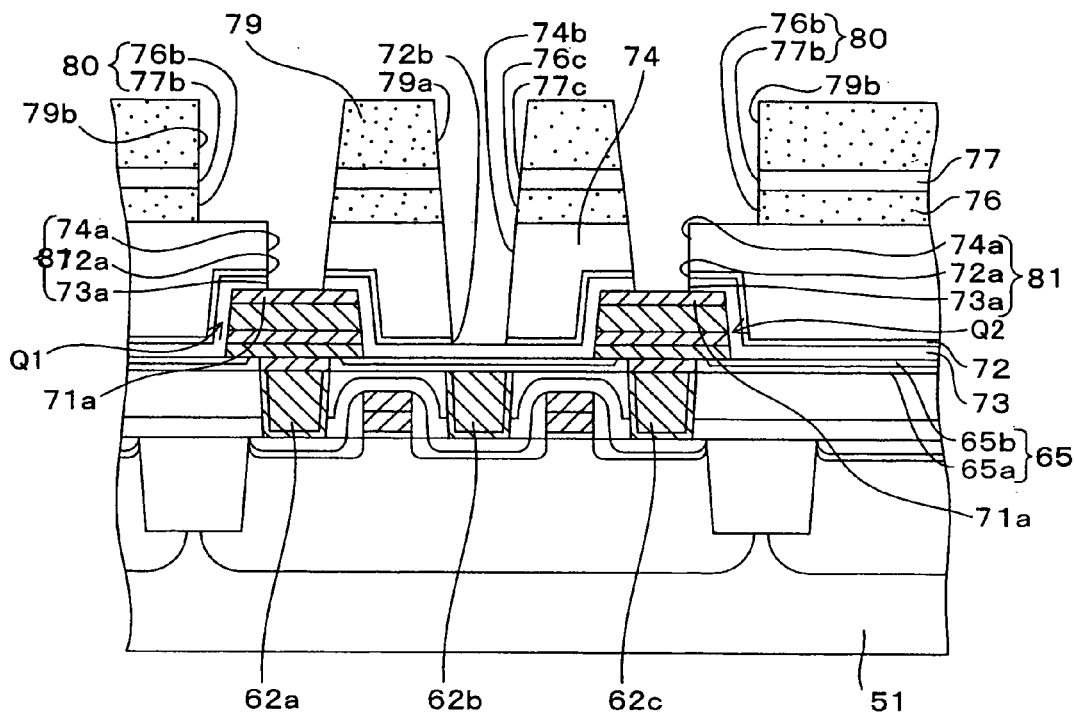

Next, steps required until a sectional structure shown in FIG. 25A is obtained will be explained hereunder.

First, the photoresist is coated on the overall surface. Then, a second resist pattern 79 having a first resist opening 79a having a hole shape and second resist openings 79b each having a wiring shape is formed by exposing/developing the photoresist. Then, the first cap film 77, the first low dielectric constant insulating film 76, the first insulating film 74, and the second capacitor protection insulating film 72 positioned under the first resist opening 79a are etched while using the second resist pattern 79 as an etching mask. Thus, third holes 76c, 77c and second holes 74b, 72b are formed in respective films. As the etching gas in this etching, a mixed gas consisting of $CF_4$, $C_4F_8$, $O_2$, and Ar, for example, is used.

Here, these holes can be formed in the foregoing etching steps (FIG. 24B). In this case, a summed depth of these holes is deeper than a total depth of respective holes 72a, 74a, 76a, 77a on the ferroelectric capacitors Q1, Q2. Therefore, it is possible that the first capacitor protection insulating film 73 on the ferroelectric capacitors Q1, Q2 is etched and the ferroelectric capacitors Q1, Q2 are exposed to the etching atmosphere for a long time and are damaged.

Here, reference is made to FIG. 25A again. In the above etching, the first cap film 77 and the first low dielectric constant insulating film 76 positioned under the second resist openings 79b are etched, and second holes 76b, 77b are formed in respective films. Each of first wiring recesses 80 consists of the second holes 76b, 77b.

In this case, the first capacitor protection insulating film 73 under the first holes 72a is etched in this etching, and the first holes 73a are formed therein. Thus, first contact holes 81 each consisting of the holes 72a to 74a are formed to extend downward from the bottom portions of the first wiring recesses 80, and also the upper electrodes 71a of the ferroelectric capacitors Q1, Q2 are exposed from insides of the first contact holes 81.

After these steps are ended, the second resist pattern 79 is removed by the ashing using the oxygen plasma.

Then, in order to recover the damages that the ferroelectric capacitors Q1, Q2 receive in the steps until now after the ferroelectric capacitors Q1, Q2 are formed, the oxygen annealing is executed at 550° C. for 60 minute in the oxygen atmosphere. Since the insulating oxygen barrier film 65 is formed on the second conductive plug 62b, the oxidation of the second conductive plug 62b during the oxygen annealing can be prevented.

Figure 25B:
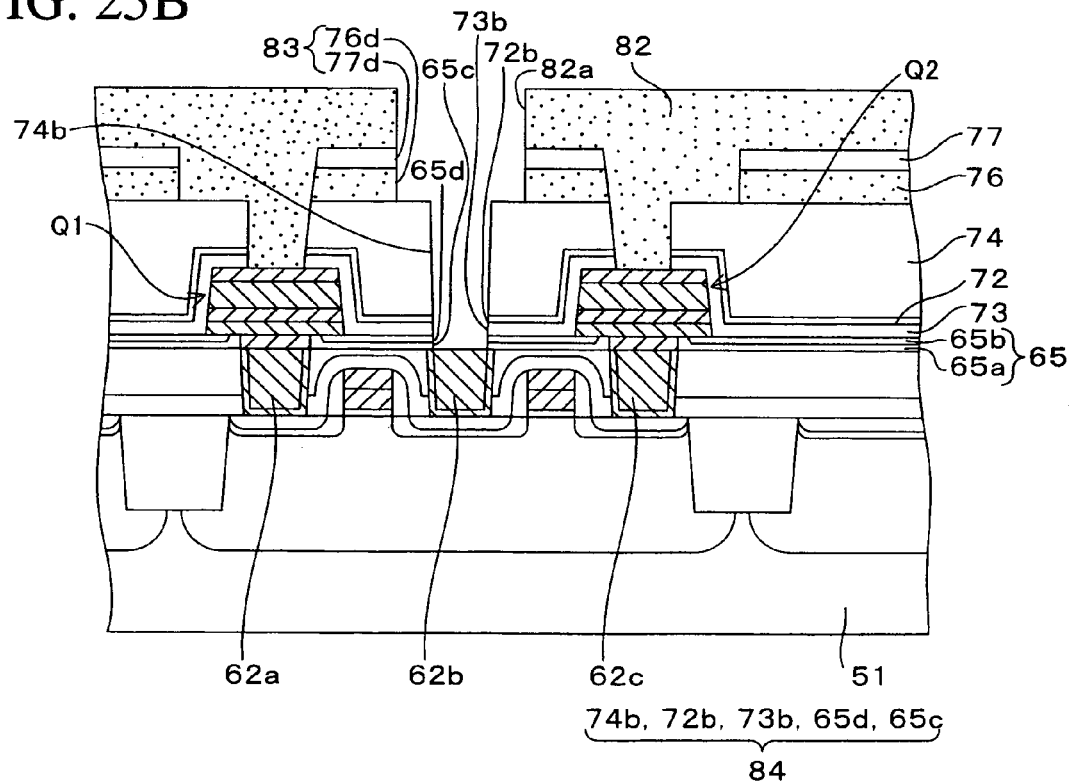

Next, steps required until a sectional structure shown in FIG. 25B is obtained will be explained hereunder.

First, the photoresist is coated on the overall surface. Then, a third resist pattern 82 having a resist opening 82a of a wiring shape is formed by exposing/developing the photoresist.

Then, the first cap film 77 and the first low dielectric constant insulating film 76 located under the resist opening 82a are etched while using the third resist pattern 82 as the etching mask. Thus, fourth holes 76d, 77d are formed in respective films and used as a second wiring recess 83. As the etching gas in this etching, a mixed gas consisting of $CF_4$, $C_4F_8$, $O_2$, and Ar, for example, is employed.

Also, the first capacitor protection insulating film 73, the insulating adhesive film 65b, and the oxidation preventing insulating film 65a under the second hole 72b are etched in this etching. Thus, a second hole 73b and first holes 65d, 65c are formed in respective films. Then, respective holes 74b, 72b, 73b, 65d, 65c are used as a second contact hole 84.

In this case, after this step is ended, the third resist pattern 82 is removed by the ashing using the oxygen plasma.

Figure 26A:
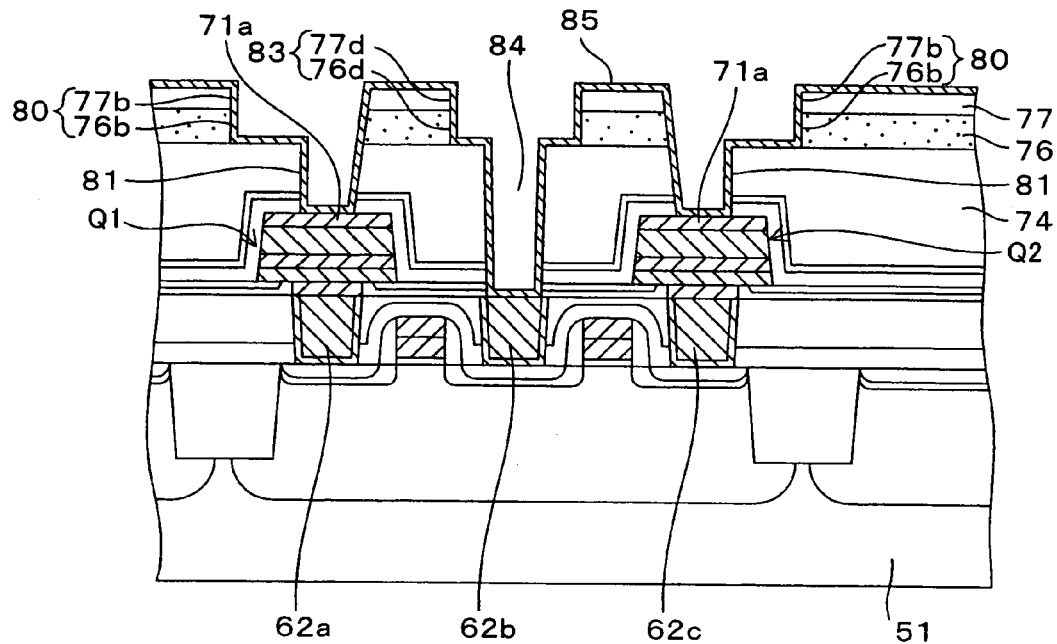

Next, steps required until a sectional structure shown in FIG. 26A is obtained will be explained hereunder.

First, respective upper surfaces of the upper electrodes 71a and the second conductive plug 62b are etched by using the Ar plasma by about 20 nm to expose the cleaned surface. Then, a TaN film of about 50 nm is formed as a first diffusion preventing film 85, which prevents the diffusion of the copper, on inner surfaces of the first and second contact holes 81, 84 and the first and second wiring recesses 80, 83 by the sputter method.

Figure 26B:
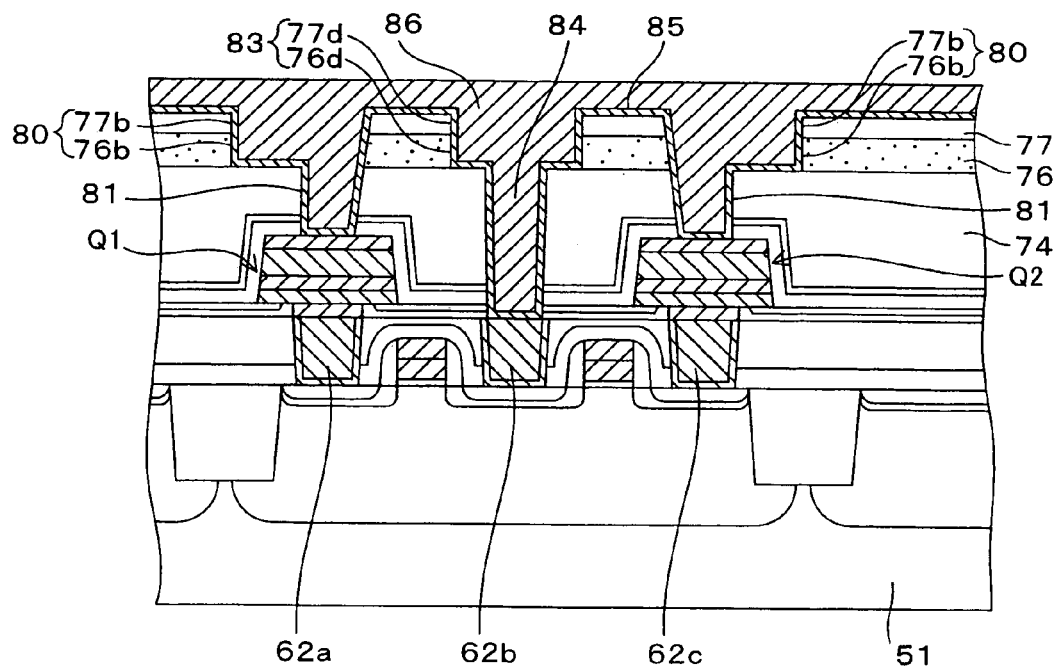

Then, as shown in FIG. 26B, a Cu seed layer (not shown) is formed on the overall surface. Then, a first copper film 86 having a thickness, which can bury perfectly inner surfaces of the first and second contact holes 81, 84 and the first and second wiring recesses 80, 83, is formed by the plating method while supplying the electric power to the Cu seed layer. In such plating method, a plating solution into which the organic substance to improve the burying property of the copper is added in addition to copper sulfate is employed. According to the plating method, since the substrate 51 is not heated, the thermal budget is lowered and thus it can be prevented that the ferroelectric capacitors Q1, Q2 are subjected to the damage by the heat.

Figure 33:
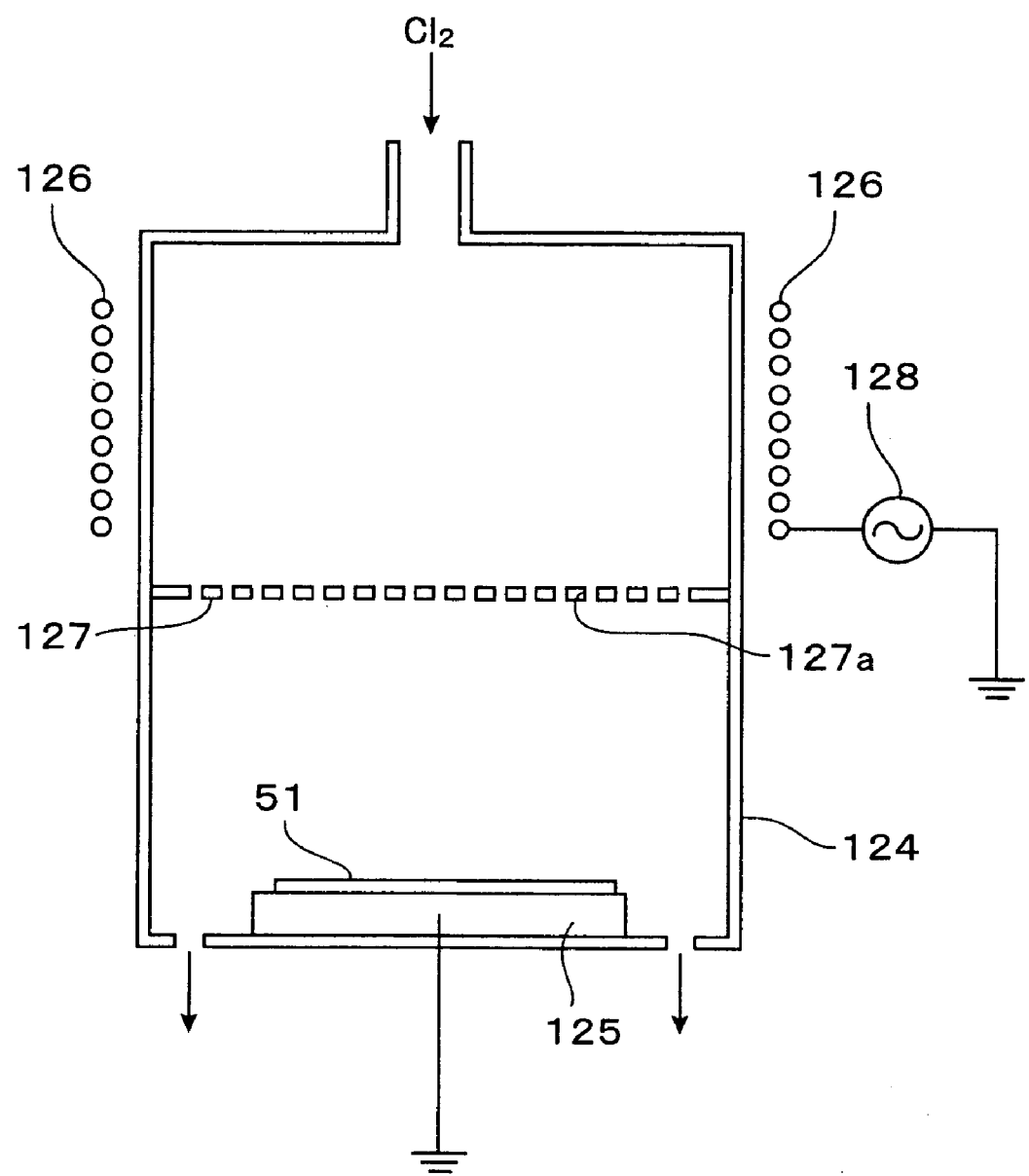
FIG. 33 is view showing a configuration of a copper film forming equipment employed in the steps of forming the semiconductor device according to the second embodiment of the present invention.

In this case, the first copper film 86 may be formed by the CVD method instead of the plating method. In such CVD method, the silicon substrate 51 is loaded on a substrate loading table 125 in a chamber 124 shown in FIG. 33, and then a Cl2 gas is introduced from the top of the chamber 124. Then, the Cl plasma is generated in the chamber 124 by supplying a high-frequency power generated by a high-frequency power supply 128, having a frequency of 13.56 MHz and a power of 3000 W, to a coil 126. Then, the Cl plasma is passed through openings 127a of a copper film 127 that is held at the temperature of about 300° C. According to this, the copper in the copper plate 127 is exposed to the Cl plasma to generate a copper chloride of $Cu_xCl_y$, and such copper chloride is adhered onto the silicon substrate 51. Since the silicon substrate 51 is held at about 200° C. that is lower than the Cl plasma, the Cl in $Cu_xCl_y$ is desorbed because of temperature difference between the silicon substrate 51 and the plasma. Thus, only the Cu is deposited onto the silicon substrate 51 and then the first copper film 86 is formed.

In this manner, if the first copper film 86 is formed by the CVD method, exposure of the first copper film 86 to the atmosphere after its formation must be avoided to prevent the formation of the natural oxide film on a surface of the first copper film 86.

Figure 27:
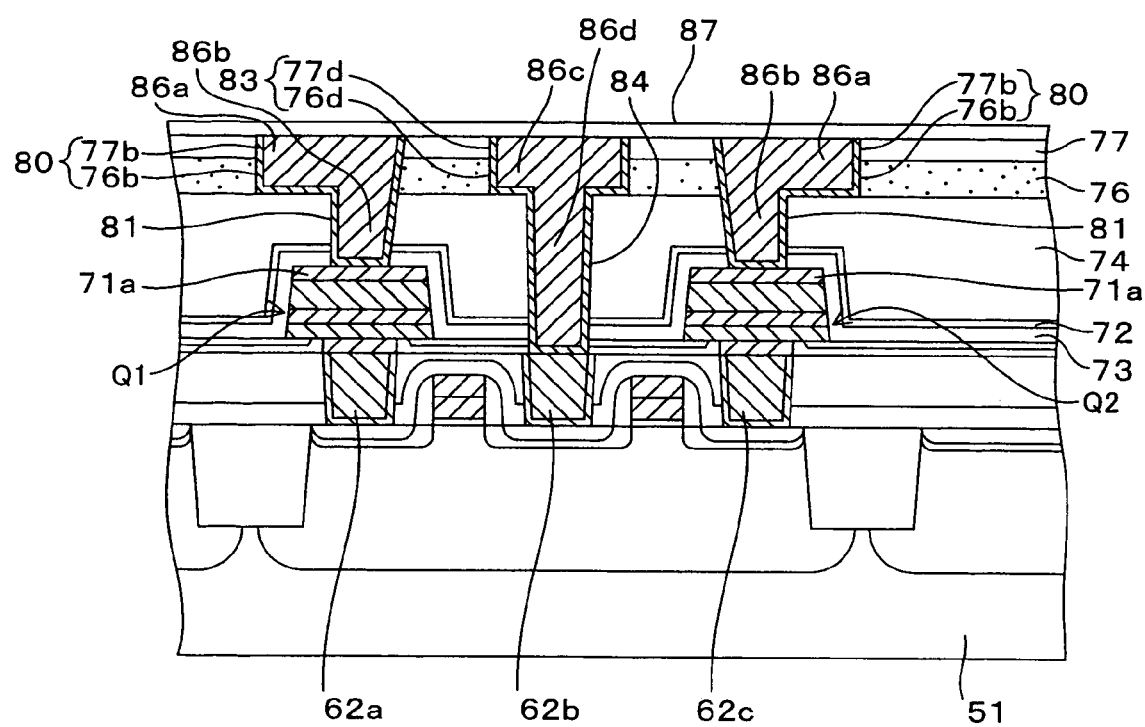

Next, steps required until a sectional structure shown in FIG. 27 is obtained will be explained hereunder.

First, the first copper film 86 and the first diffusion preventing film 85 formed over the first cap film 77 are polished by the CMP method to remove. The first copper film 86 and the first diffusion preventing film 85 that are left in the first and second wiring recesses 80, 83 and the first and second contact holes 81, 84 are used as first and second copper wirings 86a, 86c and first and second copper plugs 86b, 86d. In this case, the first copper wirings 86a are connected electrically to the upper electrodes 71a of the ferroelectric capacitors Q1, Q2 via the first copper plugs 86b, and function as the plate line. Also, the second copper wiring 86c is connected electrically to the second n-type impurity diffusion region 55b via the second copper plug 86d and the second conductive plug 62b, and functions as the bit line.

Such method of forming the copper wiring is called the dual-damascene process.

Then, in order to prevent the upward diffusion of the copper, a second diffusion preventing film 87 is formed on the overall surface. As the second diffusion preventing film 87, an SiN film having a thickness of 70 nm, for example, can be employed. It is preferable that, in order to avoid the damage of the ferroelectric capacitors Q1, Q2, the SiN film should be formed by the non-bias plasma CVD method. Otherwise, the BN film, the SiC film, and the alumina film may be employed in place of the SiN film. In addition, a conductive film made of Ta, TaN, Ti, TiN, etc. formed by the sputter method may be employed as the second diffusion preventing film 87 in place of such insulating film. If such conductive film is employed, the step of patterning the conductive film into respective shapes of the copper wirings 86a, 86c is executed after the formation of such conductive film, to prevent the electrical connection between the copper wirings 86a, 86c.

Figure 28:
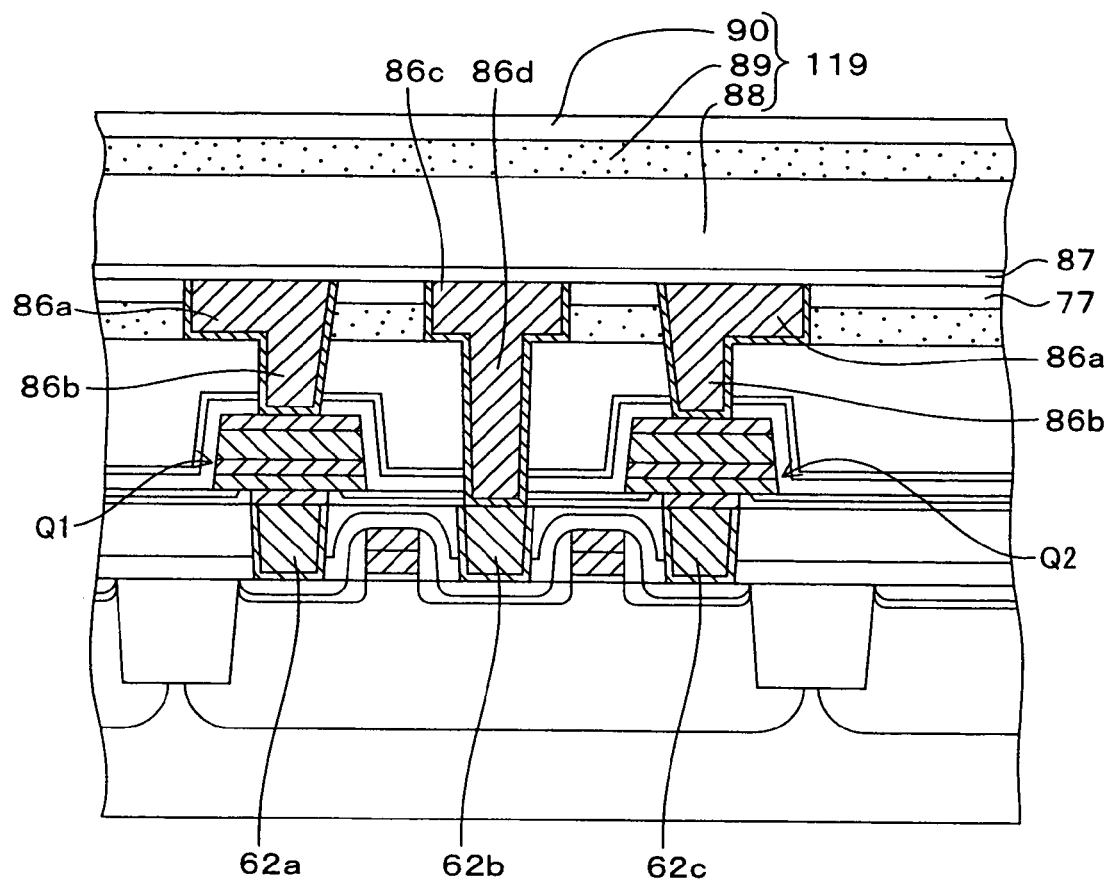

Next, steps required until a sectional structure shown in FIG. 28 is obtained will be explained hereunder.

First, an SiO$_2$ film of about 500 nm thickness is formed as a second insulating film 88 on the second diffusion preventing film 87 by the plasma CVD method using the TEOS. Then, a BN film of about 200 nm thickness is formed as a second low dielectric constant insulating film 89 on the second insulating film 88 by the non-bias plasma CVD method using B$_2$H$_6$ and N$_2$ as a reaction gas. Then, an SiO$_2$ film of 100 nm thickness is formed as a second cap film 90 on the second low dielectric constant insulating film 89 by the plasma CVD method using the TEOS. The second cap film 90 functions to prevent the upward diffusion of the gas that is desorbed from the second low dielectric constant insulating film 89.

According to the steps executed up to now, a second interlayer insulating film 119 consisting of respective insulating films 87 to 90 is formed.

Figure 29:
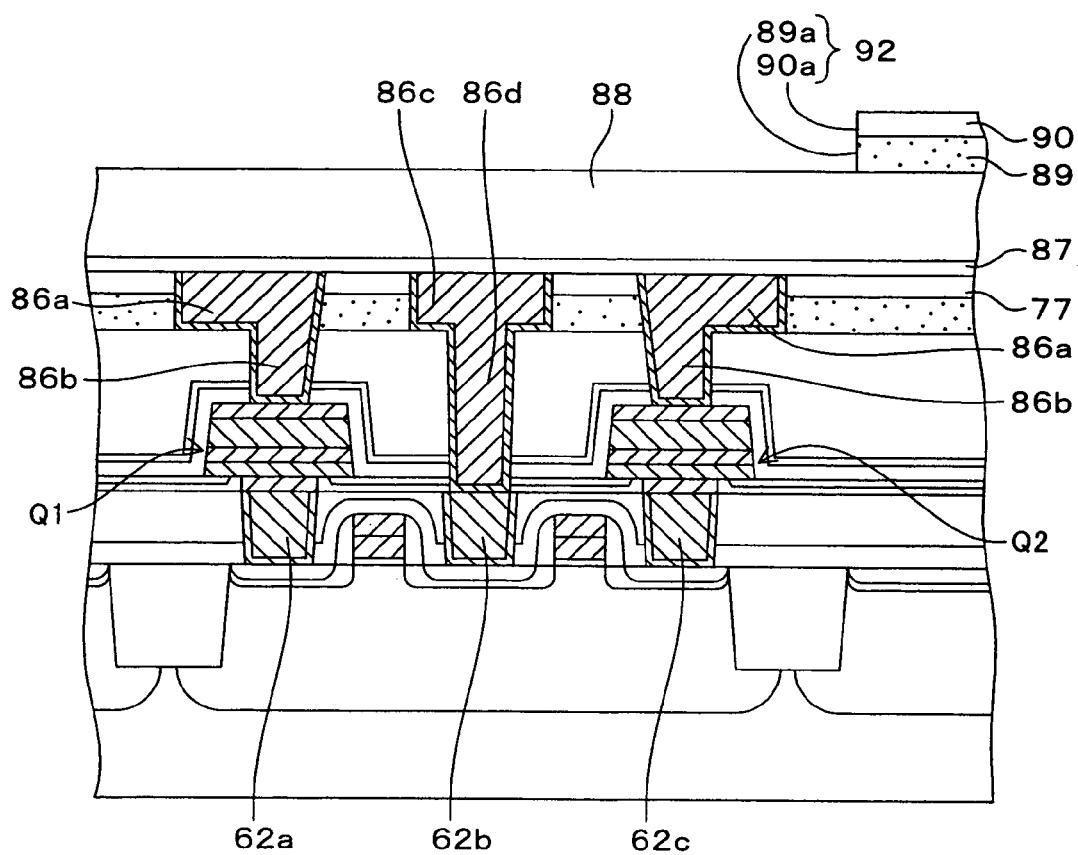

Next, steps required until a sectional structure shown in FIG. 29 is obtained will be explained hereunder.

First, a resist (not shown) is coated on the second cap film 90. Then, a resist pattern (not shown) having an opening of a metal pattern shape is formed by exposing/developing the resist. Then, the second cap film 90 and the second low dielectric constant insulating film 89 are etched by using the resist pattern as the etching mask. Thus, first holes 89a, 90a constituting a metal pattern recess 92 are formed in these films. The metal pattern recess 92 is formed over the ferroelectric capacitors Q1, Q2 and their peripheral areas to cover the cell region containing the ferroelectric capacitors Q1, Q2.

Figure 30:
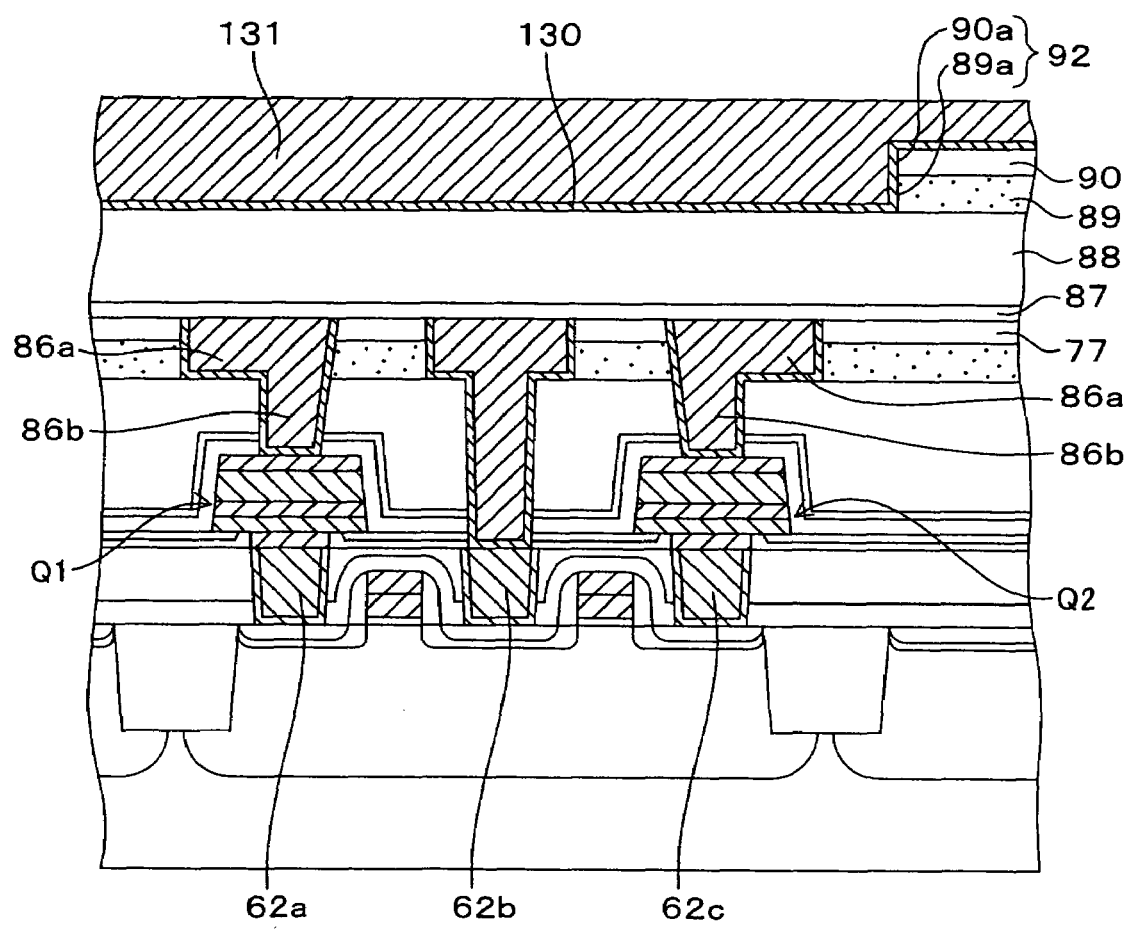

Then, as shown in FIG. 30, a TaN film of about 30 nm thickness is formed as a third diffusion preventing film 130 in the metal pattern recess 92. Then, a second copper film 131 is formed on the third diffusion preventing film 130 by the sputter method, the plating method, or the CVD method. A thickness of the second copper film 131 is set to bury perfectly the metal pattern recess 92.

Figure 31:
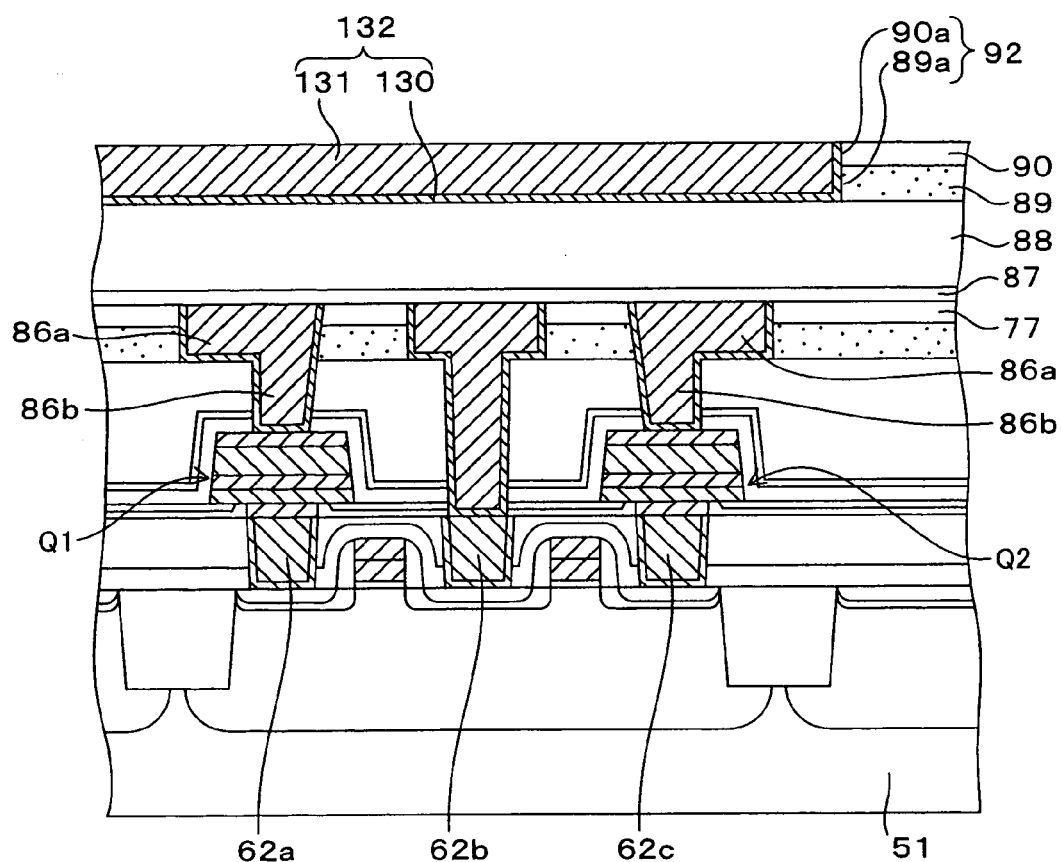

Then, as shown in FIG. 31, the third diffusion preventing film 130 and the second copper film 131 are polished by the CMP method. Thus, the third diffusion preventing film 130 and the second copper film 131 are removed from an upper surface of the second cap film 90, and also are left in the metal pattern recess 92 to constitute a metal pattern 132.

This metal pattern 132 is formed wider than the cell region to cover sufficiently the ferroelectric capacitors Q1, Q2. Also, its potential is not limited, and either a fixed potential or a floating potential that is isolated electrically may be employed.

Then, the silicon substrate 51 is fixed onto the suscepter that is held at 370° C. Then, the metal pattern 132 is annealed for 30 minute in the reduced-pressure atmosphere of the inert gas, e.g., in the N$_2$ atmosphere at the pressure of 2 Torr.

The second copper film 131 in the metal pattern 132 has the compressive stress of $-5 \times 10^{10}$ dyne/cm$^2$ prior to this annealing, but such stress is changed into the tensile stress of $5 \times 10^{10}$ dyne/cm$^2$ after this annealing. Since such change in the stress provides the preferable stress to the underlying ferroelectric capacitors Q1, Q2, ferroelectric substance characteristic of the ferroelectric capacitors Q1, Q2 can be improved.

In the above, the metal film consisting of the third diffusion preventing film 130 and the second copper film 131 is polished by the CMP method, and then the metal pattern 132 is annealed. But the sequence of the formation of the metal pattern 132 and the annealing thereof is not limited. For example, it is expected that, even if the annealing is applied to the metal film under the above conditions before the CMP, the same stress effect as the above can be produced in the metal pattern 132. In addition, the annealing may be carried out after a fourth diffusion preventing film 100 described later is formed on the metal pattern 132.

In that annealing, if the metal film is heated in excess of the melting point, the metal film is melted and the metal film does not generate the desired stress. Therefore, the annealing temperature must be set to the melting point or less of the metal film.

In addition, execution of this annealing is not limited in the reduced-pressure atmosphere of the inert gas, and such annealing may be executed in the oxygen atmosphere, the oxygen-containing atmosphere, and the inert gas-containing atmosphere.

Figure 32:
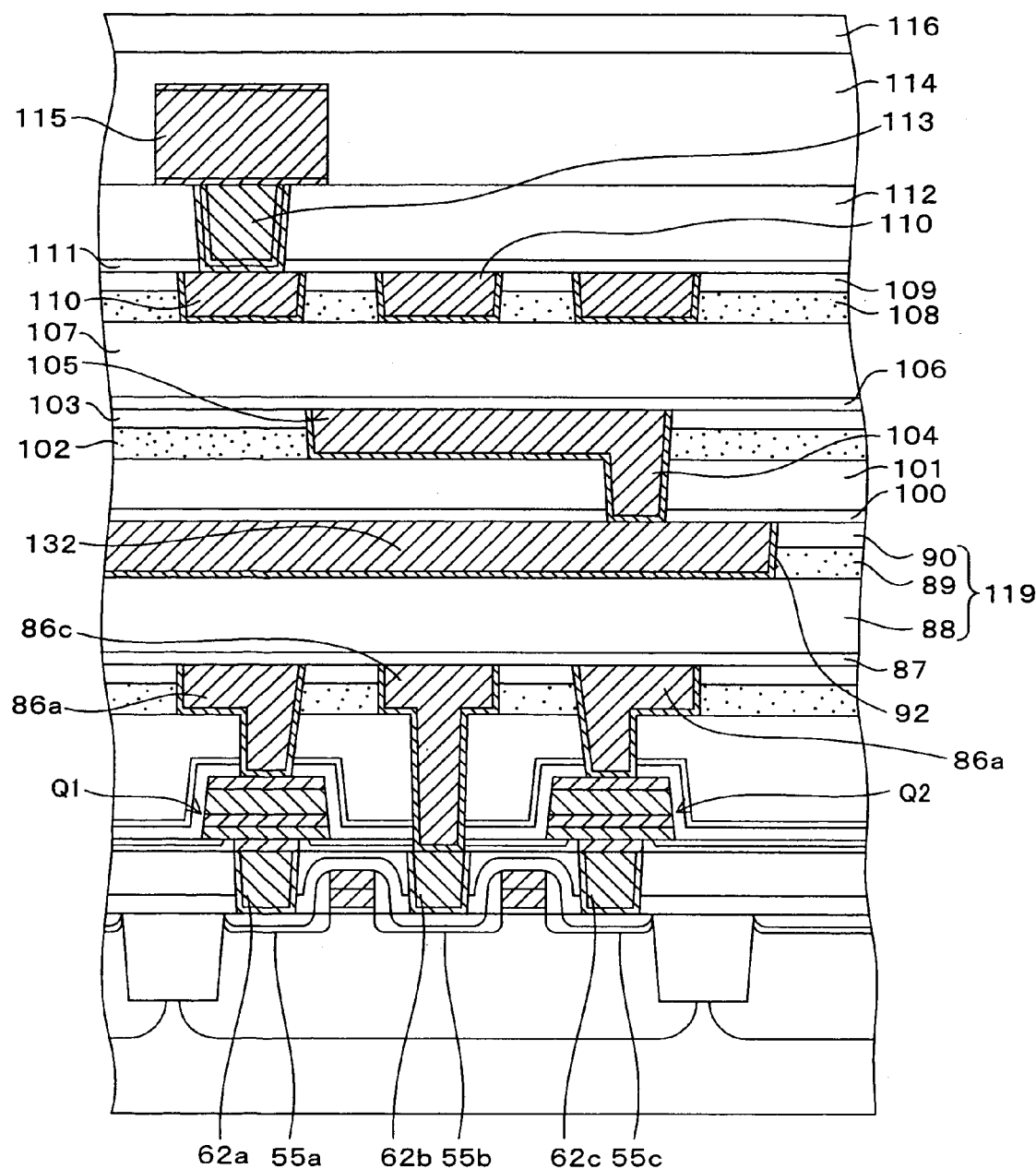

Next, steps required until a sectional structure shown in FIG. 32 is obtained will be explained hereunder.

First, an alumina film or a Ta film of about 70 nm thickness is formed as the fourth diffusion preventing film 100 on the metal pattern 132 and the second cap film 90 by the sputter method. Since the fourth diffusion preventing film 100 is formed by the sputter method, the film forming atmosphere does not become the reducing atmosphere. Thus, it can be prevented that the ferroelectric capacitors Q1, Q2 are degraded by the reducing atmosphere.

In this case, if the Ta film is used as the fourth diffusion preventing film 100, the Ta film is patterned into the shape of the metal pattern 132 after the formation of the Ta film, to prevent the situation that the metal pattern 132 is connected electrically to the wiring (not shown) formed in the same layer as the metal pattern 132.

Then, an SiO$_2$ film of about 100 nm thickness is formed as a third insulating film 101 on the fourth diffusion preventing film 100 by the plasma CVD method using the TEOS. Then, a BN film of about 200 nm thickness is formed as a third low dielectric constant insulating film 102 on the third insulating film 101. Then, an SiO$_2$ film of about 100 nm thickness is formed as a third cap film 103 on the third low dielectric constant insulating film 102 by the plasma CVD method using the TEOS.

Then, a third copper plug 104 and a third copper wiring 105 are buried in the fourth diffusion preventing film 100, the third insulating film 101, the third low dielectric constant insulating film 102, and the third cap film 103 by using the dual-damascene process. Both the third copper plug 104 and the third copper wiring 105 have a double-layered structure of the TiN film and the copper film, and are connected electrically to the underlying metal pattern 132.

Here, the metal pattern 132 is set as a floating potential, there is no necessity to connect the third copper plug 104 to the metal pattern 132. In this case, a hole may be formed to reach the metal pattern 132, and then the third copper plug 104 reaching the first copper wiring 86a may be formed not to contact to an inner surface of the hole but to pass through an inside of the hole. If doing this, the hole into which the third copper plug 104 is to be buried is formed in respective insulating films 87 to 90.

Then, an alumina film or a Ta film of about 70 nm thickness is formed as a fifth diffusion preventing film 106 on the third copper wiring 105 and the third cap film 103 by the sputter method. If the Ta film is used as the fifth diffusion preventing film 106, such Ta film is patterned into the shape of the third copper wiring 105 after the formation.

Then, an SiO$_2$ film of about 500 nm thickness is formed as a fourth insulating film 107 on the fifth diffusion preventing film 106 by the plasma CVD method using the TEOS. Then, a fourth low dielectric constant insulating film 108 made of the BN film, or the like is formed on the fourth insulating film 107 to have a thickness of about 200 nm. Then, an SiO$_2$ film is formed as a fourth cap film 109 by the plasma CVD method using the TEOS.

Then, fourth copper wirings 110 are buried in the fifth diffusion preventing film 106, the fourth insulating film 107, the fourth low dielectric constant insulating film 108, and the fourth cap film 109 by the dual-damascene process. The fourth copper wiring 110 has a double-layered structure consisting of the TiN film and the copper film, and is connected electrically to the third copper wiring 105 via the copper plug (not shown).

Then, an alumina film or a Ta film of about 70 nm thickness is formed as a sixth diffusion preventing film 111 on the fourth copper wiring 110 and the fourth cap film 109 by the sputter method. If the Ta film is used as the sixth diffusion preventing film 111, such Ta film is patterned into the shape of the fourth copper wiring 110 after the Ta film is formed. Then, an SiO$_2$ film of about 500 nm thickness is formed as a fifth insulating film 112 on the sixth diffusion preventing film 111 by the plasma CVD method using the TEOS. Then, a hole is formed in the fifth insulating film 112 and the sixth diffusion preventing film 111 by the photolithography method, and then a third conductive plug 113 is formed in the hole. The third conductive plug 113 has a laminated structure in which a TaN film, a TiN film, and a tungsten film are laminated from the bottom, for example.

Then, a multi-layered metal film is formed on the third conductive plug 113 and the fifth insulating film 112. As the multi-layered metal film, a Ti film of 60 nm thickness, a TiN film of 30 nm thickness, an Al—Cu film of 400 nm thickness, a Ti film of 5 nm thickness, and a TiN film of 70 nm thickness, for example, are formed sequentially by the sputter method. Then, a final metal wiring 115 is obtained by patterning the multi-layered metal film by virtue of the photolithography method.

Then, an SiO$_2$ film of about 1.5 μm is formed as a sixth insulating film 114, which covers the final metal wiring 115, by the plasma CVD method using the TEOS.

Finally, an SiN film is formed as a surface protection film 116, which protects a device surface, to have a thickness of about 500 nm. It is preferable that the SiN film should be formed by the non-bias plasma CVD method, for the purpose of not damaging the ferroelectric capacitors Q1, Q2.

According to the above embodiment, the metal pattern recess 92 is provided in the second interlayer insulating film 119, and then the metal pattern 132 having the tensile stress is formed therein. Therefore, the compressive stress generated in the second insulating film 88, etc. in the second interlayer insulating film 119 can be relaxed by the metal pattern. As a result, the net stress that is applied to the ferroelectric capacitors Q1, Q2 can be reduced and thus the ferroelectric characteristic of the ferroelectric capacitors Q1, Q2 can be improved.

In the above, the second interlayer insulating film 119 is composed of a plurality of insulating films 88 to 90. But the second interlayer insulating film 119 may be formed by a single-layer insulating film.

In addition, in the above, the metal pattern is constructed by the multi-layered metal film consisting of the third diffusion preventing film 130 and the second copper film 131, but such metal pattern may be constructed by other film except the multi-layered metal film. That is, any film made of aluminum, titanium, copper, tantalum, tungsten, or a film made of any alloy of their elements or their mixture.

As described above, according to the semiconductor device according to the present invention, the metal pattern having the stress in the opposite direction to the second insulating film is provided. Therefore, the stress applied from the second insulating film to the capacitor can be relaxed by the stress of the metal pattern and thus the ferroelectric characteristic of the capacitor can be improved. In addition, since the metal pattern never desorbs the moisture unlike the insulating film, the capacitor is never deteriorated by the moisture.

Also, according to the semiconductor device manufacturing method according to the present invention, the stress of the metal film is changed by heating the metal film at the temperature of the melting point or less before or after the formation of the metal pattern. Therefore, the stress of the second insulating film can be relaxed by the metal film and thus the ferroelectric characteristic of the capacitor can be improved.

What is claimed is:

1. A manufacturing method of semiconductor device comprising:
    forming a first insulating film over a semiconductor substrate;
    forming capacitors, each having a lower electrode, a dielectric film, and an upper electrode, on the first insulating film in a cell region;
    forming a second insulating film over the capacitors and the first insulating film;
    forming a metal film on the second insulating film;
    forming a metal pattern, which covers the cell region, by patterning the metal film; and heating the metal film at a melting point or less of the metal film before or after the formation of the metal pattern, to change a stress of the metal film.

2. A method according to claim 1 further comprising:
forming a metal wiring in a region, which is away from the metal pattern, by patterning the metal film.

3. A method according to claim 1, wherein the second insulating film is a film that is formed by using a reaction gas containing TEOS.

4. A method according to claim 1, wherein heating of the metal film is executed in a reduced-pressure atmosphere.

5. A method according to claim 1, wherein heating of the metal film is executed in any one of an oxygen atmosphere, an oxygen containing atmosphere, an inert gas atmosphere, and an inert gas containing atmosphere.

6. A method according to claim 1 further comprising:
forming a third insulating film on the metal film before heating the metal film.

7. A method according to claim 1, wherein formation of the metal pattern is formation of a film that is made of any one of material selected from the group consisting of aluminum, titanium, copper, tantalum, and tungsten, or made of material containing any one selected from the group consisting of aluminum, titanium, copper, tantalum, and tungsten.

8. A method according to claim 1, wherein the stress of the metal film is changed into a stress, which is opposite to a stress of the second insulating film, by heating the metal film.

9. A method according to claim 8, wherein the stress of the metal film is changed into a tensile stress by heating the metal film.

10. A method according to claim 1, wherein the second insulating film has a compressive stress.

11. A method according to claim 1, wherein the metal film is formed to have a single-layer structure or a multi-layered structure.

* * * * *